(12) United States Patent
Taketani

(10) Patent No.: US 9,705,213 B2
(45) Date of Patent: Jul. 11, 2017

(54) ELECTRONIC DEVICE AND SPACING TUBE

(71) Applicant: FUJITSU LIMITED, Kawasaki-shi, Kanagawa (JP)

(72) Inventor: Yoshinori Taketani, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 161 days.

(21) Appl. No.: 14/540,412

(22) Filed: Nov. 13, 2014

(65) Prior Publication Data
US 2015/0144376 A1    May 28, 2015

(30) Foreign Application Priority Data
Nov. 28, 2013  (JP) ................................. 2013-246730

(51) Int. Cl.
*H01R 12/52* (2011.01)
*H05K 7/14* (2006.01)
*H05K 1/14* (2006.01)

(52) U.S. Cl.
CPC ........... *H01R 12/523* (2013.01); *H01R 12/52* (2013.01); *H05K 1/144* (2013.01); *H05K 7/142* (2013.01); *H05K 2201/042* (2013.01); *H05K 2201/2036* (2013.01)

(58) Field of Classification Search
CPC .................................................. H01R 12/523
See application file for complete search history.

(56) References Cited

U.S. PATENT DOCUMENTS

| | | | | |
|---|---|---|---|---|
| 3,596,138 A * | 7/1971 | Lehrfeld | ................ | H01R 12/52 333/238 |
| 3,742,309 A * | 6/1973 | Sterner | .................. | H05K 3/368 174/158 R |
| 3,812,381 A * | 5/1974 | Guyton | .................. | H05K 7/142 361/774 |
| 4,483,632 A * | 11/1984 | Dewey | .................... | G01K 7/023 361/714 |
| 5,018,982 A * | 5/1991 | Speraw | .................. | H05K 7/142 174/138 D |
| 5,345,366 A * | 9/1994 | Cheng | .................... | H01R 12/52 174/138 G |
| 2006/0046532 A1* | 3/2006 | Hjort | ...................... | H05K 1/144 439/74 |

(Continued)

FOREIGN PATENT DOCUMENTS

| | | |
|---|---|---|
| JP | 5-17939 | 3/1993 |
| JP | 6-132624 | 5/1994 |
| JP | 08-330699 | 12/1996 |

OTHER PUBLICATIONS

Japanese Office Action mailed May 9, 2017 in related Japanese Application No. 2013-246730.

*Primary Examiner* — James Harvey
(74) *Attorney, Agent, or Firm* — Staas & Halsey LLP

(57) ABSTRACT

An electronic device includes: a spacing tube including a first conductor of a tubular shape with both end faces forming electrical connection, and a second conductor provided inside the first conductor to be electrically spaced from the first conductor, the second conductor including recess to be engaged with screws in both ends thereof; and a first wiring board and a second wiring board which are attached to opposite ends of the spacing tube by the screws fastened to the recess, respectively, and electrically coupled with each other through the first conductor and the second conductor.

15 Claims, 22 Drawing Sheets

(56) References Cited

U.S. PATENT DOCUMENTS

| | | | | |
|---|---|---|---|---|
| 2007/0289773 A1* | 12/2007 | Caletka | ................ | H05K 1/0219 |
| | | | | 174/262 |
| 2009/0268416 A1* | 10/2009 | Kanda | .................... | H05K 7/142 |
| | | | | 361/752 |
| 2014/0211432 A1* | 7/2014 | Lozano | .................. | H05K 7/142 |
| | | | | 361/759 |
| 2014/0290052 A1* | 10/2014 | Bujade | ................... | H05K 7/142 |
| | | | | 29/830 |
| 2015/0029687 A1* | 1/2015 | Gillard | ................ | H05K 9/0007 |
| | | | | 361/753 |
| 2015/0144376 A1* | 5/2015 | Taketani | ................ | H05K 7/142 |
| | | | | 174/113 R |

* cited by examiner

ELECTRONIC DEVICE AND SPACING TUBE

CROSS-REFERENCE TO RELATED APPLICATION

This application is based upon and claims the benefit of priority of the prior Japanese Patent Application No. 2013-246730 filed on Nov. 28, 2013, the entire contents of which are incorporated herein by reference.

FIELD

The embodiments discussed herein are related to an electronic device and a spacing tube.

BACKGROUND

Spacing tubes (spacers) have been used in order to connect a plurality of printed wiring boards while maintaining a predetermined spacing therebetween.

Regarding the connection of printed wiring boards using a spacing tube, a technique described hereinbelow has been proposed. For example, a mounting method has been proposed in which power signal layers and GND signal layers are exposed on the surfaces of printed wiring boards where a plurality of conductive spacers is joined, and the printed wiring boards are fixed to each other using a conductive spacer which corresponds to the power signal layers and the GND signal layers, respectively. In addition, a mounting method has been proposed in which a single conductive spacer is divided into a plurality of conductive spacers, and a plurality of power signal layers and GND signal layers of printed wiring boards are exposed to correspond to the divided conductive spacers so as to supply a plurality of power signals and GND signals.

A configuration described below may be exemplified as a configuration that connects two printed wiring boards mechanically and electrically using a spacing tube including two conductors which are electrically separated from each other.

For example, a through hole is provided in a central portion of a spacing tube so as to insert a screw therethrough. Two electrically separated conductors are exposed on both end faces which are abutted on the printed wiring boards, respectively. The two conductors are electrically separated from each other in a circumferential direction along an outer edge of the through hole. Each of the printed wiring boards is formed with a wiring pattern corresponding to the two conductors of the spacing tube on a surface where the spacing tube is abutted, and also provided with a through hole through which a screw is inserted. That is, each of the printed wiring boards is formed with two wiring patterns which are divided in a circumferential direction along the outer edge of the through hole. When positioning of the two conductors of the spacing tube and the two wiring patterns formed on each of the printed wiring boards is performed, the bolt is inserted through the through hole of the spacing tube and the through hole of each of the printed wiring boards, and a nut is attached to the bolt from the opposite side, so that the two printed wiring boards are connected with each other with the spacing tube sandwiched therebetween.

According to the aforementioned configuration, the two printed wiring boards are mechanically connected with each other while maintaining a predetermined spacing therebetween through the spacing tube and at the same time, two electrically separated conductive paths are formed between the two printed wiring boards.

However, according to the aforementioned configuration, it is difficult to align the two conductors provided in the spacing tube and the two wiring patterns formed on each of the printed wiring boards. That is, in a case in which the conductors of the spacing tube and the wiring patterns of each of the printed wiring boards are divided in the circumferential directions along the outer edges of the through holes, respectively, it is necessary to strictly perform positioning in the circumferential direction (in the direction around the axis of the spacing tube) when attaching the spacing tube to each of the printed wiring boards so as to prevent short circuit. Accordingly, a work burden increases regarding the positioning of the spacing tube and each printed wiring board.

The following is a reference document.
[Document 1] Japanese Laid-Open Patent Publication No. H08-330699

SUMMARY

According to an aspect of the invention, an electronic device includes: a spacing tube including a first conductor of a tubular shape with both end faces forming electrical connection, and a second conductor provided inside the first conductor to be electrically spaced from the first conductor, the second conductor including recess to be engaged with screws in both ends thereof; and a first wiring board and a second wiring board which are attached to opposite ends of the spacing tube by the screws fastened to the recess, respectively, and electrically coupled with each other through the first conductor and the second conductor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
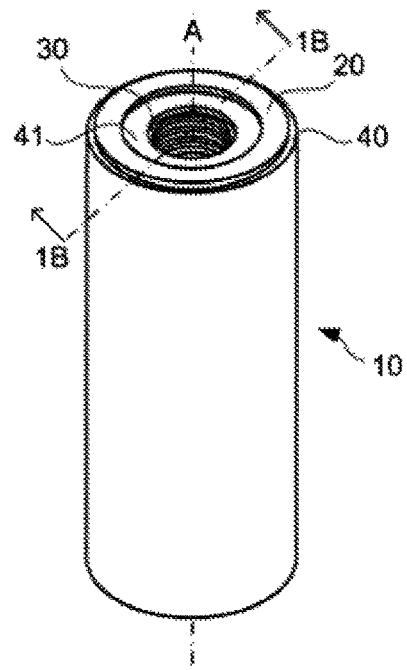
FIG. 1A is a perspective view of a spacing tube according to an exemplary embodiment of the present disclosure.

Hereinafter, exemplary embodiments of the present disclosure will be described with reference to the accompanying drawings. In each drawing, same or equivalent components and portions are denoted by the same reference numerals.

First Exemplary Embodiment

Figure 1B:
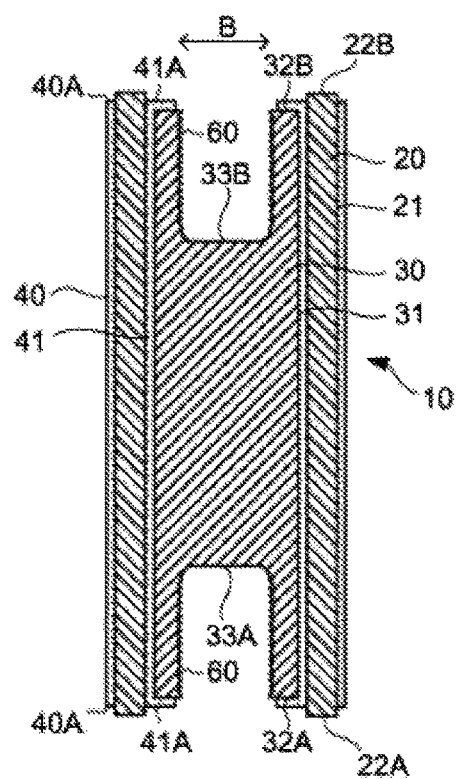
FIG. 1B is a cross-sectional view taken along the line 1B-1B in FIG. 1A.

FIG. 1A is a perspective view of a spacing tube 10 according to a first exemplary embodiment of the present disclosure, and FIG. 1B is a cross-sectional view taken along the line 1B-1B in FIG. 1A.

The spacing tube 10 has a columnar external shape, and includes a first conductor 20, a second conductor 30, an insulator 40, and an insulator 41.

The first conductor 20 has a tubular (more specifically, a cylindrical) external shape, including a side face 21 and end faces 22A and 22B.

The second conductor 30 has a substantially columnar external shape, including a side face 31 and end faces 32A and 32B, and is entirely accommodated inside the first conductor 20.

The first conductor 20 and the second conductor 30 are disposed such that the centers thereof coincide with each other. In addition, the first conductor 20 and the second conductor 30 are electrically separated from each other. That is, the first conductor 20 and the second conductor 30 are electrically separated from each other in a radial direction of the spacing tube 10. Here, the radial direction refers to a direction of being spaced apart from a center line A illustrated in FIG. 1A in a plane orthogonal to the center line A (the direction indicated by the arrow B in FIG. 1B). For example, a conductive metal such as steel, a stainless steel, or aluminum may be, but not exclusively, used as a material of the first conductor 20 and the second conductor 30.

The insulator 41 is interposed between the first conductor 20 and the second conductor 30 so that the first conductor 20 and the second conductor 30 are not contacted with each other. In addition, the insulator 41 partially covers the end faces 32A and 32B of the second conductor 30. The insulator 40 entirely covers the side face 21 of the first conductor 20. For example, an insulative rubber or resin may be used, but not exclusively, as a material of the insulators 40 and 41.

The end faces 22A and 22B of the first conductor 20 protrude in a height direction of the spacing tube 10 in relation to the end faces 40A and 41A of the insulators 40 and 41 and the end faces 32A and 32B of the second conductor 30, and form annular electrical connection portions.

The second conductor 30 includes fastened portions to be engaged with fastening members such as screws, in opposite ends thereof. That is, columnar recessed portions 33A and 33B are provided at the central portions of the end faces 32A and 32B of the second conductor 30, as the fastened portions, and threads 60 are formed on the inner circumferential surfaces of the recessed portions 33A and 33B. The recessed portions 33A and 33B are also recessed in relation to the end faces 22A and 22B of the first conductor 20.

In addition, the spacing tube 10 is an example of a spacing tube in the present disclosure. The first conductor 20 and second conductor 30 are examples of first and second conductors in the present disclosure, respectively. The insulator 41 is an example of a first insulator in the present disclosure, and the insulator 40 is an example of a second insulator in the present disclosure. The recessed portions 33A and 33B are examples of recessed portions in the present disclosure.

Figure 2:
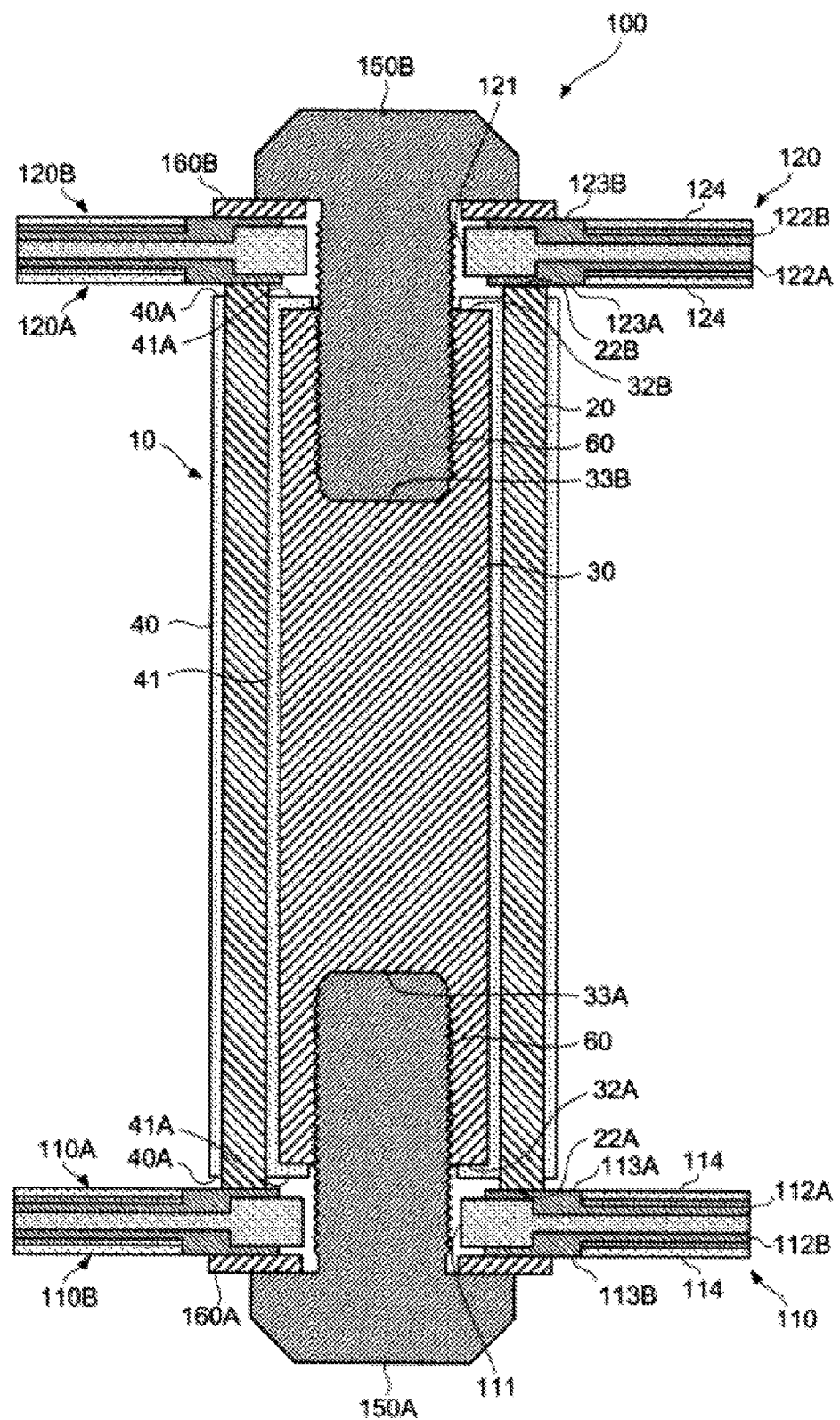
FIG. 2 is a cross-sectional view illustrating a partial configuration of a wiring board assembly structure according to a first exemplary embodiment of the present disclosure.

FIG. 2 is a cross-sectional view illustrating a partial configuration of the wiring board assembly structure 100 according to the first exemplary embodiment of the present disclosure. The wiring board assembly structure 100 includes the aforementioned spacing tube 10, a printed wiring board 110 attached to one end of the spacing tube 10, and a printed wiring board 120 attached to the other end of the spacing tube 10. For example, one of the printed wiring board 110 and the printed wiring board 120 may be a main board, and the other may be a sub-board. In addition, the wiring board assembly structure 100 is an example of a wiring board assembly structure in the present disclosure. The printed wiring board 110 is an example of a first wiring board in the present disclosure, and the printed wiring board 120 is an example of a second wiring board in the present disclosure.

The printed wiring board 110 and the printed wiring board 120 are connected to be parallel to each other while maintaining a predetermined spacing therebetween through the spacing tube 10. In addition, although only one spacing tube 10 is illustrated in the example illustrated in FIG. 2, the printed wiring board 110 and the printed wiring board 120 may be connected using two or more spacing tubes 10.

The printed wiring board 110 includes a through hole 111 at an attachment position of the spacing tube 10. The printed wiring board 110 is attached to one end of the spacing tube 10 by a screw 150A which is inserted through the through hole 111 from a surface 110B side and fastened to the recessed portion 33A of the second conductor 30 of the spacing tube 10.

The printed wiring board 110 includes a wiring pattern 112A formed at a surface 110A side where the spacing tube 10 is attached, and a wiring pattern 112B formed at the surface 110B side where the screw 150A is attached. The wiring pattern 112A includes an electrode 113A exposed to a surface at least in an outer circumferential portion of the through hole 111. The wiring pattern 112A is covered with the resist 114 except for the electrode 113A. Similarly, the wiring pattern 112B includes an electrode 113B exposed to the surface at least in an outer peripheral portion of the through hole 111, and the wiring pattern 112B is covered with the resist 114 except for the electrode 113B.

Figure 3A:
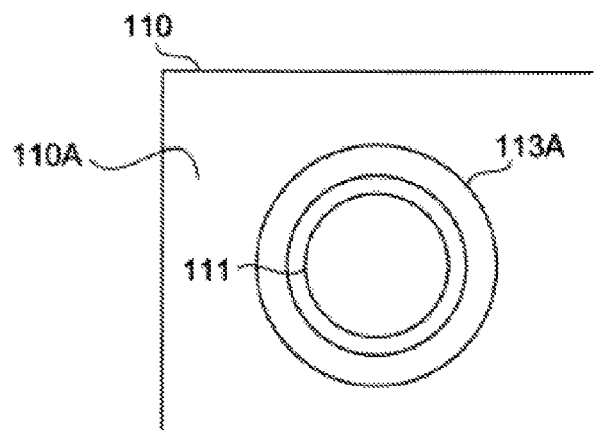
FIG. 3A is a plan view of an electrode provided on a printed wiring board according to an exemplary embodiment of the present disclosure.
Figure 3B:
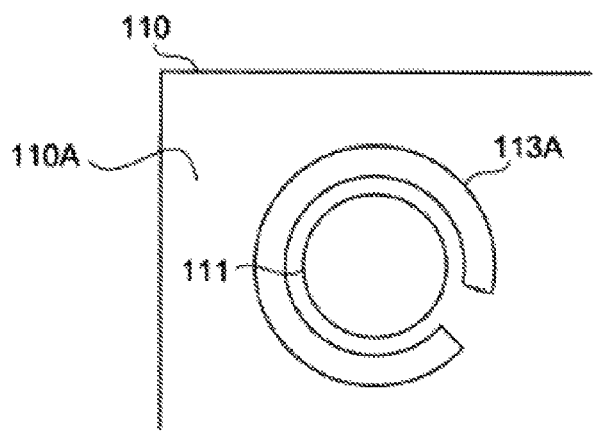
FIG. 3B is a plan view of an electrode provided on the printed wiring board according to the exemplary embodiment of the present disclosure.
Figure 3C:
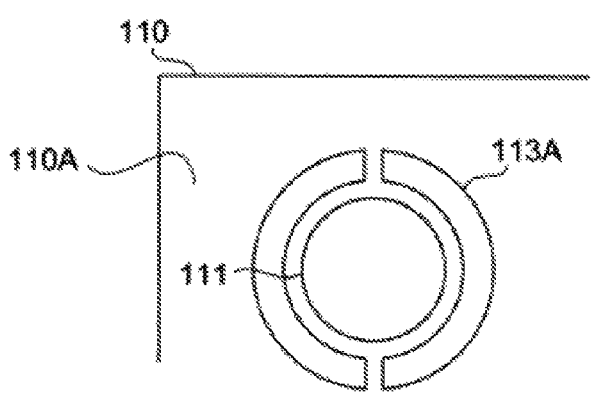
FIG. 3C is a plan view of an electrode provided on the printed wiring board according to the exemplary embodiment of the present disclosure.

FIG. 3A is a plan view illustrating an exemplary electrode 113A installed at the surface 110A side of the printed wiring board 110. As described below, the end face 22A of the first conductor 20 of the spacing tube 10 is abutted on the electrode 113A. The electrode 113A extends along an outer edge of the through hole 111, and forms an annular ring shape corresponding to the external shape of the end face 22A of the first conductor 20 of the spacing tube 10. In addition, as illustrated in FIG. 3B, the electrode 113A may be formed in a pattern of an annular ring, of which a portion is removed. In addition, the electrode 113A may include a plurality of electrode members which is separated from each other, as illustrated in FIG. 3C. In addition, the electrode 113A may be formed such that when the spacing tube 10 is attached, the end face 22A of the first conductor 20 may be abutted on the electrode 113A. The end face 22A may be formed in a shape other than the annular ring, for example, in a rectangular ring shape. In addition, the electrode 113B of the surface 110B side of the printed wiring board 110 may also be formed in the same shape as the electrode 113A.

Referring back to FIG. 2, the end face 22A of the first conductor 20 of the spacing tube 10 is abutted on the electrode 113A of the printed wiring board 110. That is, the first conductor 20 of the spacing tube 10 is electrically connected to the electrode 113A and the wiring pattern 112A provided at the surface 110A side of the printed wiring board 110. Because the end face 22A of the first conductor protrudes in relation to the end face 40A of the insulator 40 and the end face 41A of the insulator 41, the contactability between the end face 22A of the first conductor 20 and the electrode 113A becomes better as compared to the case in which the end face 22A does not protrude. Meanwhile, the second conductor 30 of the spacing tube 10 is not contacted with the electrode 113A.

The screw 150A is inserted through the through hole 111 from the surface 110B side of the printed wiring board 110, and engaged with the threads 60 formed on the inner circumferential surface of the recessed portion 33A of the second conductor 30 of the spacing tube 10, thereby being fastened to the recessed portion 33A. The screw 150A is conductive. A washer 160A is provided between the screw 150A and the surface 110B of the printed wiring board 110 and abutted on the electrode 113B. The washer 160A is conductive. That is, the second conductor 30 of the spacing tube 10 is electrically connected to the electrode 113B and the wiring pattern 112B provided at the surface 110B side of the printed wiring board 110 through the washer 160A and the screw 150A. In addition, the washer 160A is a member which is provided as needed in order to prevent the loosening of the screw 150A and may be omitted. When the washer 160A is not provided, the screw 150A is abutted on the electrode 113B.

Meanwhile, the printed wiring board 120 includes a through hole 121 at an attachment position of the spacing tube 10 similarly to the printed wiring board 110. The printed wiring board 120 is attached to the other end of the spacing tube 10 by the screw 150B which is inserted through the through hole 121 from the surface 120B side and fastened to the recessed portion 33B of the second conductor 30 of the spacing tube 10.

The printed wiring board 120 includes a wiring pattern 122A formed at a surface 120A side where the spacing tube 10 is attached, and a wiring pattern 122B formed at a surface 120B side where the screw 150B is attached. The wiring pattern 122A includes an electrode 123A exposed to the surface at least in the outer circumferential portion of the through hole 121. The wiring pattern 122A is covered with a resist 124 except for the electrode 123A. Similarly, the wiring pattern 122B includes an electrode 123B which is exposed to the surface at least in the outer circumferential portion of the through hole 121, and the wiring pattern 122B is covered with the resist 124 except for the electrode 123B. In addition, the shapes of the electrode 123A and 123B may be the same as the shape of the electrode 113A provided on the printed wiring board 110 (see, e.g., FIGS. 3A to 3C).

The end face 22B of the first conductor 20 of the spacing tube 10 is abutted on the electrode 123A of the printed wiring board 120. That is, the first conductor 20 of the spacing tube 10 is electrically connected to the electrode 123A and the wiring pattern 122A provided at the surface 120A side of the printed wiring board 120. Because the end face 22B of the first conductor 20 protrudes in relation to the end face 40A of the insulator 40 and the end face 41A of the insulator 41, the contactability between the end face 22B of the first conductor 20 and the electrode 123A becomes better as compared to a case in which the end face 22B does not protrude. Meanwhile, the second conductor 30 of the spacing tube 10 is not contacted with the electrode 123A.

The screw 150B is inserted through the through hole 121 from the surface 120B side of the printed wiring board 120, and engaged with threads 60 formed on the inner circumferential surface of the recessed portion 33B of the second conductor 30 of the spacing tube 10 to be fastened to the recessed portion 33B. The screw 150B is conductive. A washer 160B is provided between the screw 150B and the surface 120B of the printed wiring board 120, and abutted on the electrode 123B. The washer 160B is conductive. That is, the second conductor 30 of the spacing tube 10 is electrically connected to the electrode 123B and the wiring pattern 122B provided at the surface 120B side of the printed wiring board 120 through the washer 160B and the screw 150B. In addition, the washer 160B is a member which is provided as needed in order to prevent the loosening of the screw 150B, and may be omitted. When the washer 160B is not provided, the screw 150B is abutted on the electrode 123B.

As described above, the printed wiring board 110 and the printed wiring board 120 are connected with each other not only mechanically but also electrically through the spacing tube 10. Specifically, the printed wiring board 120 is supported on the printed wiring board 110 through the spacing tube 10. In addition, the wiring pattern 112A of the surface 110A side of the printed wiring board 110 is electrically connected to the wiring pattern 122A of the surface 120A side of the printed wiring board 120 through the first conductor 20 of the spacing tube 10. The wiring pattern 112B of the surface 110B side of the printed wiring board 110 is electrically connected to the wiring pattern 122B of the surface 120B side of the printed wiring board 120 through the washer 160A, the screw 150A, the second conductor 30 of the spacing tube 10, the screw 150B, and the washer 160B.

As described above, because two conductive paths are formed between the printed wiring board 110 and the printed wiring board 120 through the spacing tube 10, two potentials may be transferred between the printed wiring board 110 and the printed wiring board 120 through the spacing tube 10. For example, a ground potential may be transferred between the wiring pattern 112A and the wiring pattern 122A through the first conductor 20 and a power potential may be transferred between the wiring pattern 112B and the wiring pattern 122B through the second conductor 30.

Figure 4A:
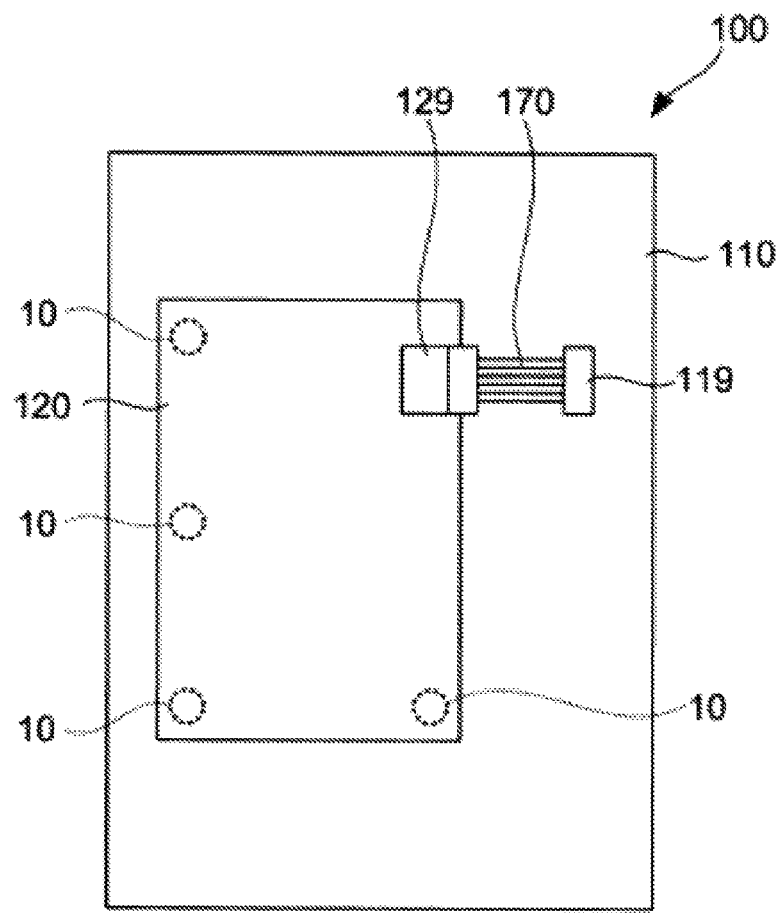
FIG. 4A is a top plan view illustrating an entire configuration of a wiring board assembly structure according to an exemplary embodiment of the present disclosure.
Figure 4B:
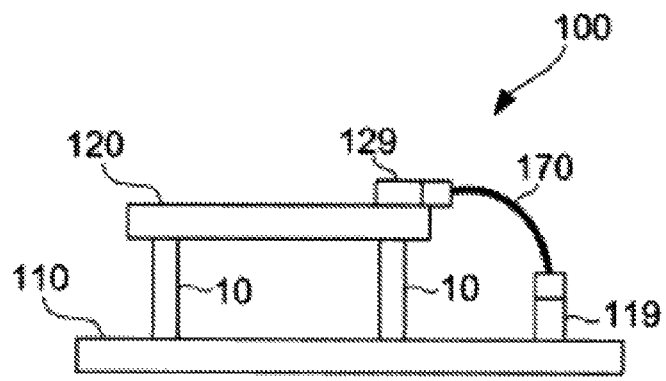
FIG. 4B is a side view illustrating the entire configuration of the wiring board assembly structure of the exemplary embodiment of the present disclosure.

FIG. 4A is a top plan view illustrating an exemplary entire configuration of the wiring board assembly structure 100, and FIG. 4B is a side view. The printed wiring board 120 is supported on the printed wiring board 110 using, for example, four spacing tubes 10. A connector 119 is provided on the printed wiring board 110, and a connector 129 is provided on the printed wiring board 120. The connector 119 and the connector 129 are connected with opposite terminals of the connector attachment cable 170, respectively. The printed wiring board 110 and the printed wiring board 120 transmit/receive various signals and are supplied with power as needed through the connector attachment cable 170.

Figure 5:
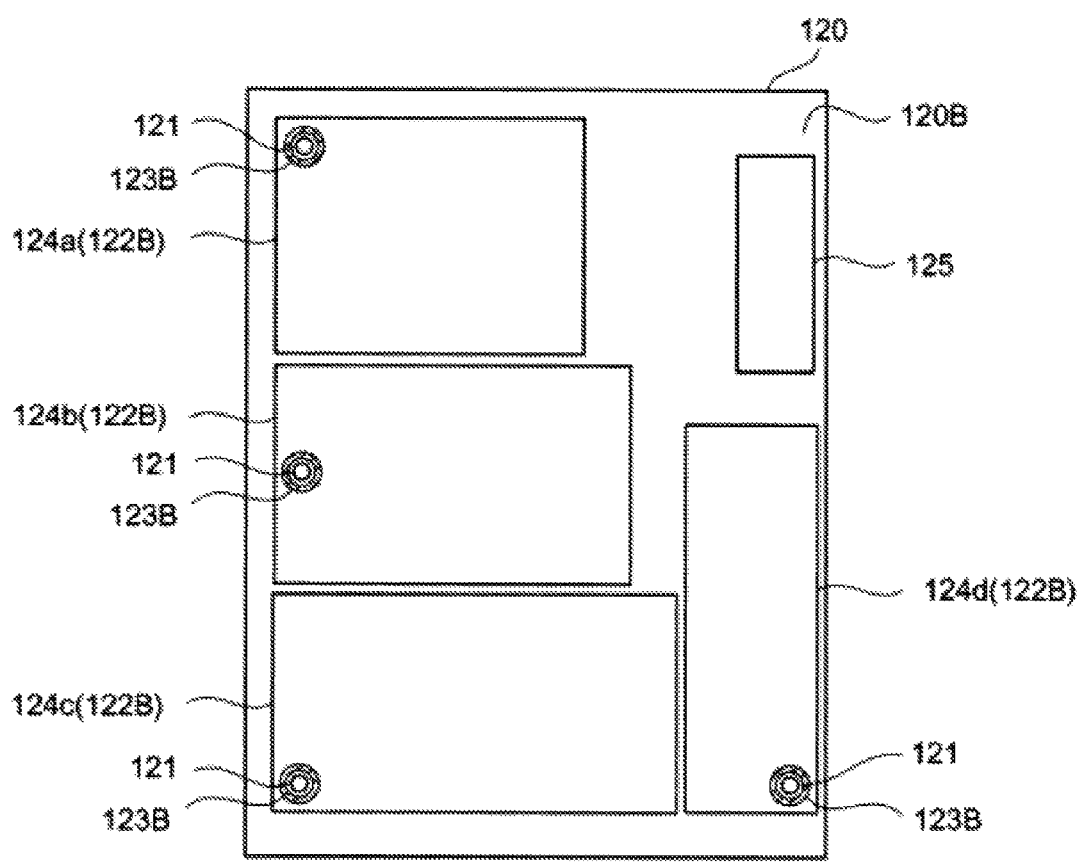
FIG. 5 is a plan view illustrating an exemplary wiring pattern formed on a printed wiring board according to an exemplary embodiment of the present disclosure.

FIG. 5 is a plan view illustrating an exemplary wiring pattern 122B formed at the surface 120B side of the printed wiring board 120. In addition, the wiring pattern illustrated in FIG. 5 may be the wiring pattern 122A formed at the surface 120A side of the printed wiring board 120. In addition, the wiring pattern illustrated in FIG. 5 may be the wiring pattern 112A or the wiring pattern 112B formed on the printed wiring board 110.

At the surface 120B side of the printed wiring board 120, a first power supply pattern 124a, a second power supply pattern 124b, a third power supply pattern 124c, and a fourth power supply pattern 124d are provided as wiring patterns 122B. Four spacing tubes 10 are attached at positions where the spacing tubes 10 overlap with the first to fourth power supply patterns 124a to 124d, respectively. Through holes 121 are formed in the printed wiring board 120 at portions which correspond to the attachment positions of the spacing tubes 10, respectively, and an electrode 123B is formed on an outer circumferential portion of each of the through holes 121. The first to fourth power supply patterns 124a to 124d are abutted on the electrodes 123B, respectively, and electrically connected with the second conductors 30 of the spacing tubes 10 through screws which are inserted through the through holes 121, respectively. Further, a connector mounting region 125 for mounting the connector 129 is secured on the surface 120B of the printed wiring board 120.

As being apparent from the foregoing description, according to the spacing tube 10 and the wiring board assembly structure 100 according to the exemplary embodiment, the printed wiring board 110 and the printed wiring board 120 may be connected not only mechanically but also electrically while maintaining a predetermined spacing therebetween. Further, because the spacing tube 10 includes the first conductor 20 and the second conductor 30 which are electrically separated from each other, two different potentials may be transferred between the printed wiring board 110 and the printed wiring board 120.

In addition, the first conductor 20 and the second conductor 30 are electrically separated from each other in the radial direction of the spacing tube 10, and include recessed portions 33A and 33B which serve as fastened members to be engaged with fastening members in the both ends of the second conductor 30. Thus, positioning of the spacing tube 10 and the printed wiring boards 110 and 120 in the circumferential direction of the spacing tube 10 becomes needless. That is, only when the spacing tube 10 is attached to the printed wiring board 110 using the screw 150A, the end face 22A of the first conductor 20 of the spacing tube 10 is abutted on the electrode 113A of the printed wiring board 110 in a self-alignment manner. The second conductor 30 of the spacing tube 10 is electrically connected to the electrode 113B and the wiring pattern 112B of the printed wiring board 110 through the screw 150A. Similarly, only when the spacing tube 10 is attached to the printed wiring board 120 using the screw 150B, the end face 22B of the first conductor 20 of the spacing tube 10 is abutted on the electrode 123A of the printed wiring board 120 in the self-alignment manner. In addition, the second conductor 30 of the spacing tube 10 is electrically connected to the electrode 123B and the wiring pattern 122B of the printed wiring board 120 through the screw 150B. Even if the spacing tube 10 is rotated around its own axis, the electrical connection of the printed wiring board 110 and the printed wiring board 120 through the spacing tube 10 is not changed. That is, short-circuit is not caused between the wiring pattern 112A and wiring pattern 112B, and between the wiring pattern 122A and the wiring pattern 122B which are provided with different potentials.

Figure 6A:
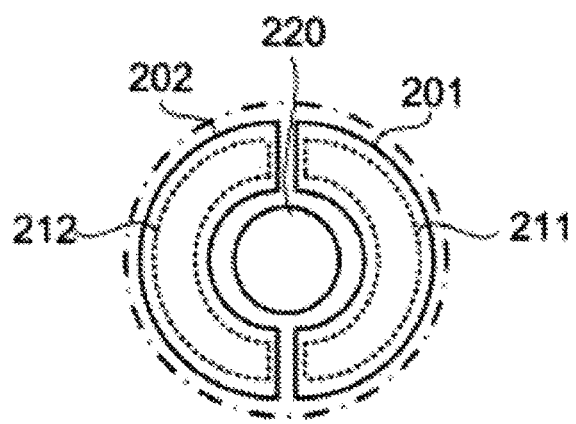
FIG. 6A is a schematic view illustrating an electrical connection type of a spacing tube according to a comparative example and a printed wiring board.

FIG. 6A is a schematic view illustrating an electrical connection type of a spacing tube according to a comparative example and a printed wiring. In the example illustrated in FIG. 6A, a spacing tube includes two conductors 211 and 212 indicated by broken lines which are electrically separated from each other in the circumferential direction of an end face of the spacing tube. The circumferential direction refers to a direction according to the outer edge of the end face of the spacing tube which is indicated by a dotted chain line in FIG. 6A. Meanwhile, the printed wiring board includes an electrode 201 corresponding to the conductor 211 of the spacing tube and an electrode 202 corresponding to the conductor 212 of the spacing tube in the same plane in the outer circumferential portion of a through hole 220 through which a screw is inserted.

Figure 6B:
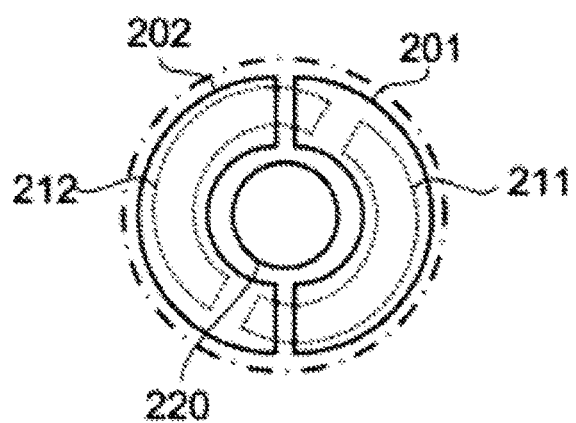
FIG. 6B is a schematic view illustrating an electrical connection type of a spacing tube according to a comparative example and a printed wiring board.

As illustrated in FIG. 6A, the electrical connection of the spacing tube and the printed wiring board is performed by causing the conductor 211 of the spacing tube to be abutted on the electrode 201 of the printed wiring board, and causing the conductor 212 of the spacing tube to be abutted on the electrode 202 of the printed wiring board. At this time, when the spacing tube is rotated around its own axis as illustrated in FIG. 6B, the conductors 211 and 212 may be contacted with both the electrodes 201 and 202 to be short-circuited. Accordingly, in order to prevent the short-circuit, it is needed to strictly perform the positioning of the conductors 211 and 212 of the spacing tube and the electrodes 201 of 202 of the printed wiring board in the direction around the axis of the spacing tube. In a configuration in which a plurality of conductors is electrically separated from each other in the circumferential direction of the spacing tube and connected with a plurality of electrodes provided in the same plane of each of the printed wiring boards as described above, a work burden is high according to the positioning of the spacing tube and the printed wiring boards.

Meanwhile, according to the electrical connection type between the spacing tube 10 and the printed wiring boards 110 and 120 according to the present exemplary embodiment, a strict positioning of the first conductor 20 and the second conductor 30 and each of the electrodes 113A, 113B, 123A, and 123B is not necessary as described above.

In addition, according to the wiring board assembly structure 100 according to the present exemplary embodiment, the first conductor 20 is electrically connected to the wiring pattern of one surface of the printed wiring board, and the second conductor 30 is electrically connected to the wiring pattern of the other surface of the printed wiring board through a fastening member. Accordingly, the electrical connection of the wiring pattern formed on each surface of one printed wiring board and the wiring pattern formed on each surface of the other printed wiring board may be performed using one spacing tube 10.

Further, as illustrated in FIG. 5, the spacing tubes 10 may be attached to the positions where the spacing tubes 10 overlap with the first to fourth power supply patterns 124a to 124d, and it is not necessary to secure a dedicated region for attaching the spacing tubes 10 separately from the regions formed with the wiring patterns. Accordingly, an area efficiency of printed wiring boards may be improved as compared to a case in which a spacing tube which does not include an electrical connecting portion is used only for the purpose of mechanical connection of the printed wiring boards.

In addition, because the power supply between the printed wiring board 110 and the printed wiring board 120 is performed through the spacing tube 10, a power wiring may be reduced in the connector attachment cable 170. Thus, the sizes of the connector 119 on the printed wiring board 110 and the connector 129 on the printed wiring board 120 may be reduced. Thus, for example, in the printed wiring board 120, the connector mounting region 125 illustrated in FIG. 5 may be reduced and the area use efficiency of the printed wiring board 120 may be enhanced. Regarding the printed wiring board 110, the connector mounting region may also be reduced and the area use efficiency may also be enhanced. In addition, in a configuration including a connector cable only for use in power supply, because the power supply between the printed wiring board 110 and the printed wiring board 120 is performed through the spacing tube 10, the corresponding connector cable may be reduced entirely.

Figure 7:
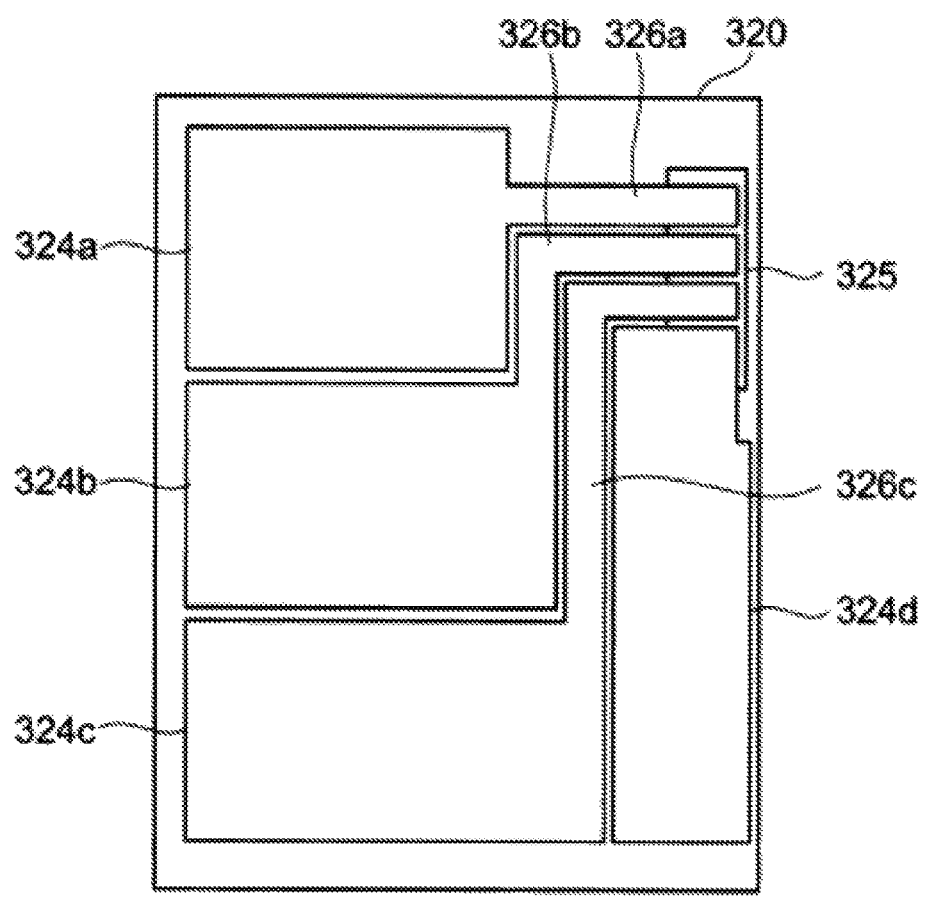
FIG. 7 is a plan view illustrating an exemplary wiring pattern formed on a printed wiring board according to a comparative example.

FIG. 7 is a plan view illustrating an exemplary pattern formed on a printed wiring board 320 according to a comparative example when the power supply between printed wiring boards is performed through a connector cable rather than a spacing tube.

The printed wiring board 320 includes a connector mounting region 325 where a connector connected to a connector cable is mounted. The printed wiring board 320 is provided with a first power supply pattern 324a, a second power supply pattern 324b, a third power supply pattern 324c, and a fourth power supply pattern 324d as wiring patterns. In addition, the printed wiring board 320 is provided with wirings 326a to 326c extending from the first power supply pattern 324a, the second power supply pattern 324b, and the third power supply pattern 324c to the connector mounting region 325. That is, the first to third power supply patterns 324a to 324c are connected to the connector cable through connection wirings 326a to 326c.

When the power supply between the printed wiring boards is performed through the connector cable as described above, it is needed to provide the connection wires 326a to 326c interconnecting the first to third power supply patterns 324a to 324c and the connector mounting region 325 on a separate printed wiring board. In addition, when a sufficient width of the connection wirings 326a to 326c is not capable of being secured, the resistance value of the connection wirings 326a to 326c is increased, which causes a voltage drop.

Meanwhile, in the present exemplary embodiment, the power supply between the printed wiring board 110 and the printed wiring board 120 is performed through the spacing tube 10 so that a conductive path may be directly extracted from the power supply patterns 124a to 124d. Accordingly, as illustrated in FIG. 5, a connection wiring that connects the connector mounting region 125 and the power patterns 124a to 124d becomes needless. Thus, a space may be saved on the printed wiring board, and the problem of the voltage drop may be avoided.

Second Exemplary Embodiment

Figure 8A:
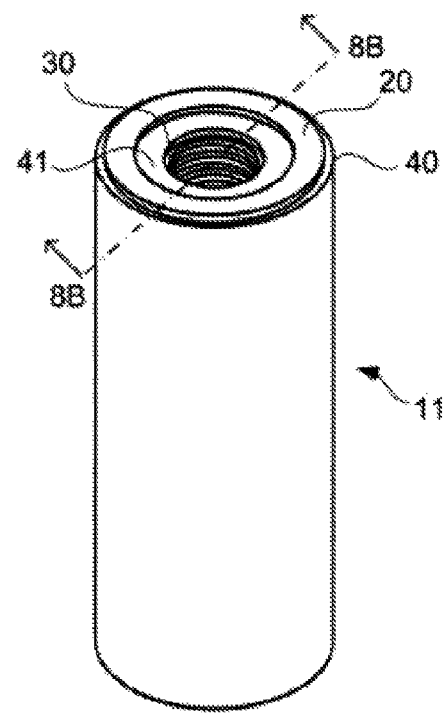
FIG. 8A is a perspective view of a spacing tube according to an exemplary embodiment of the present disclosure.
Figure 8B:
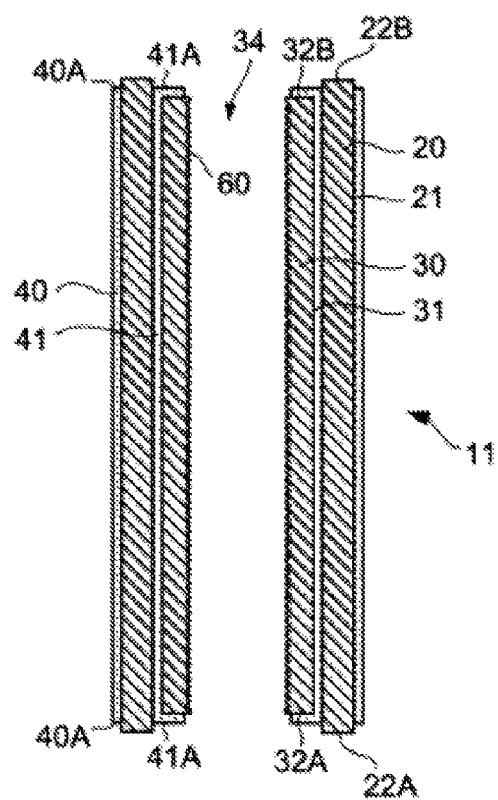
FIG. 8B is a cross-sectional view taken along the line 8B-8B in FIG. 8A.

FIG. 8A is a perspective view of a spacing tube 11 according to a second exemplary embodiment of the present disclosure, and FIG. 8B is a cross-sectional view taken along the line 8B-8B in FIG. 8A.

The spacing tube 11 according to the second exemplary embodiment includes a first conductor 20, a second conductor 30, an insulator 40, and an insulator 41, similarly to the spacing tube 10 according to the first exemplary embodiment.

The spacing tube 11 according to the second exemplary embodiment includes, as a fastened portion to be engaged with a fastening member such as a screw, a through hole 34 extending through the second conductor 30 from one end face 32A to the other end face 32B. In addition, threads 60 are formed on an inner circumferential surface of the through hole 34. The first conductor 20 and the second conductor 30 are disposed such that the centers thereof coincide with each other, and electrically separated from each other. That is, the first conductor 20 and the second conductor 30 are electrically separated from each other in the radial direction of the spacing tube 11.

The configurations of the first conductor 20, the insulator 40, and the insulator 41 are the same as those in the spacing tube 10 according to the first exemplary embodiment. Thus, detailed descriptions on these components will be omitted. In addition, the spacing tube 11 is an example of a spacing tube in the present disclosure. The through hole 34 is an example of a through hole in the present disclosure.

Figure 9:
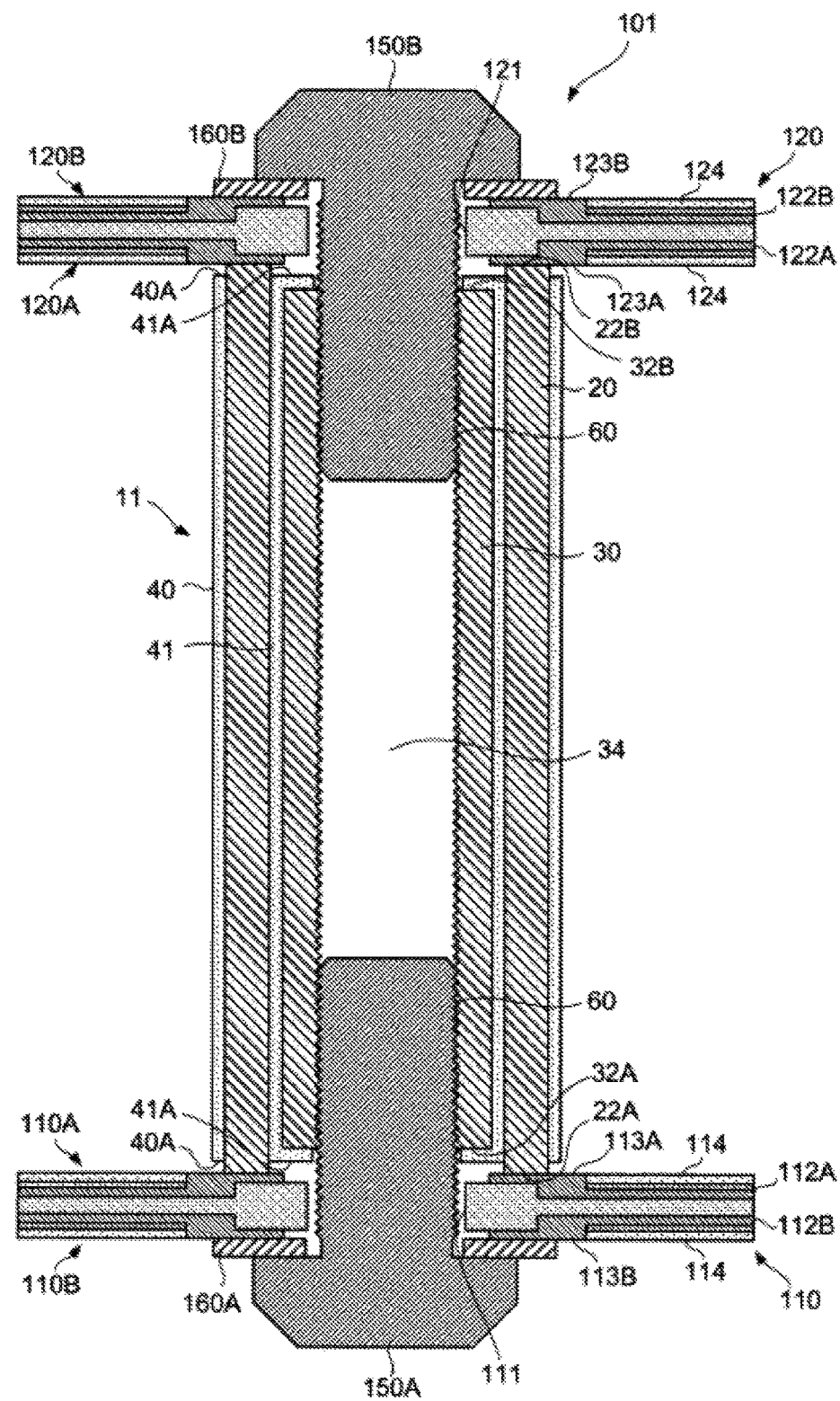
FIG. 9 is a cross-sectional view illustrating a partial configuration of a wiring board assembly structure according to an exemplary embodiment of the present disclosure.
Figure 10:
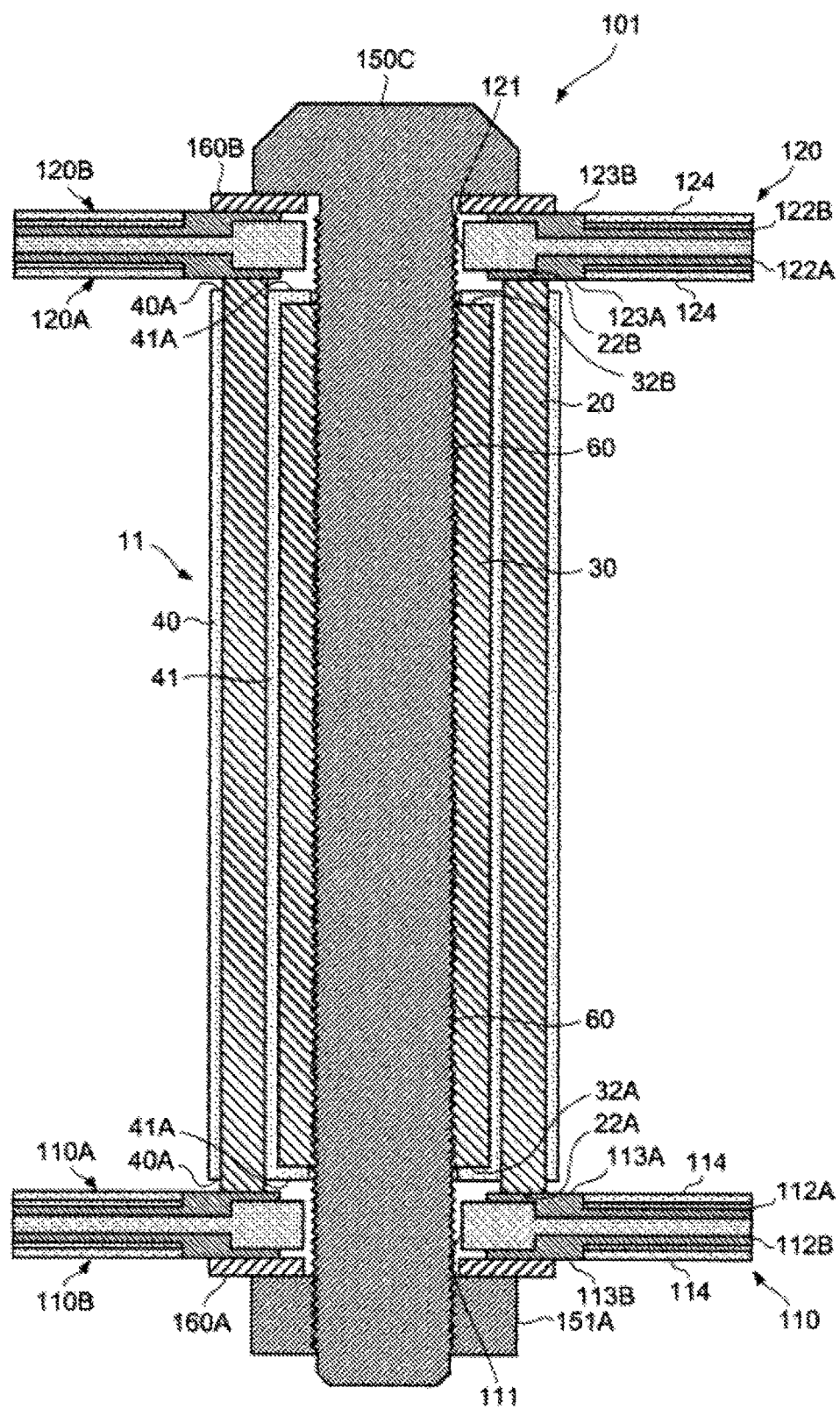
FIG. 10 is a cross-sectional view illustrating a partial configuration of a wiring board assembly structure according to an exemplary embodiment of the present disclosure.

FIG. 9 is a cross-sectional view illustrating a partial configuration of a wiring board assembly structure 101 according to the second exemplary embodiment of the present disclosure. The wiring board assembly structure 101 includes the aforementioned spacing tube 11, a printed wiring board 110 attached to one end of the spacing tube 11, and a printed wiring board 120 attached to the other end of the spacing tube 11. In addition, the wiring board assembly structure 101 is an example of a wiring board assembly structure in the present disclosure.

The printed wiring board 110 and the printed wiring board 120 are connected to be parallel to each other while maintaining a predetermined spacing therebetween through the spacing tube 11. In addition, although only one spacing tube 11 is indicated in the example illustrated in FIG. 9, the connection of the printed wiring board 110 and the printed wiring board 120 may be performed using two or more spacing tubes 11. The configurations of the printed wiring board 110 and the printed wiring board 120 are the same as those in the first exemplary embodiment.

The printed wiring board 110 is attached to one end of the spacing tube 11 by a screw 150A which is inserted through the through hole 111 and inserted into the through hole 34 of the second conductor 30 of the spacing tube 11.

An end face 22A of the first conductor 20 of the spacing tube 11 is abutted on an electrode 113A of the printed wiring board 110. That is, the first conductor 20 of the spacing tube 11 is electrically connected with the electrode 113A and a wiring pattern 112A provided at a surface 110A side of the printed wiring board 110. Because the end face 22A of the first conductor 20 protrudes in relation to an end face 40A of the insulator 40 and an end face 41A of the insulator 41, the contactability of the end face 22A of the first conductor 20 and the electrode 113A becomes better as compared to a case in which the end face 22A does not protrude. Meanwhile, the second conductor 30 of the spacing tube 11 is not contacted with the electrode 113A.

The screw 150A is inserted through the through hole 111 from the surface 110B side of the printed wiring board 110, and inserted into the through hole 34 of the second conductor 30 of the spacing tube 11. The screw 150A is engaged with the threads 60 formed on the inner circumferential surface of the through hole 34 to be fastened to the second conductor 30. The screw 150A is conductive. A washer 160A is provided between the screw 150A and the surface 110B of the printed wiring board 110, and abutted on the electrode 113B. The washer 160A is conductive. That is, the second conductor 30 of the spacing tube 11 is electrically connected to the electrode 113B and the wiring pattern 112B provided at the surface 110B side of the printed wiring board 110 through the washer 160A and the screw 150A. In addition, the washer 160A is a member which is provided as needed in order to prevent the loosening of the screw 150A, and may be omitted. When the washer 160A is not provided, the screw 150A is directly abutted on the electrode 113B.

The printed wiring board 120 is attached to the other end of the spacing tube 11 by a screw which is inserted through the through hole 121 and inserted into the through hole 34 of the second conductor 30 of the spacing tube 11.

An end face 22B of the first conductor 20 of the spacing tube 11 is abutted on the electrode 123A of the printed wiring board 120. That is, the first conductor 20 of the spacing tube 11 is electrically connected to the electrode 123A and the wiring pattern 122A provided at the surface 120A side of the printed wiring board 120. Because the end face 22B of the first conductor 20 protrudes in relation to the end face 40A of the insulator 40 and the end face 41A of the insulator 41, the contactability of the end face 22B of the first conductor 20 and the electrode 123A becomes better as compared to a case in which the end face 22B does not protrude. Meanwhile, the second conductor 30 of the spacing tube 11 is not contacted with the electrode 123A.

The screw 150B is inserted through the through hole 121 from the surface 120B side of the printed wiring board 120, and inserted into the through hole 34 of the second conductor 30 of the spacing tube 11. The screw 150B is engaged with the threads 60 formed on the inner circumferential surface of the through hole 34 to be fastened to the second conductor 30. The screw 150B is conductive. A washer 160B is provided between the screw 150B and the surface 120B of the printed wiring board 120 and abutted on the electrode 123B. The washer 160B is conductive. That is, the second conductor 30 of the spacing tube 11 is electrically connected to the electrode 123B and the wiring pattern 122B provided at the surface 120B side of the printed wiring board 120 through the washer 160B and the screw 150B. In addition, the washer 160B is a member which is provided as needed in order to prevent the loosening of the screw 150B and may be omitted. When the washer 160B is not provided, the screw 150B is abutted on the electrode 123B.

As described above, the printed wiring board 110 and the printed wiring board 120 are connected with each other not only mechanically but also electrically through the spacing tube 11. Specifically, the printed wiring board 120 is supported on the printed wiring board 110 through the spacing tube 11. In addition, the wiring pattern 112A of the surface 110A side of the printed wiring board 110 is electrically connected to the wiring pattern 122A of the surface 120A side of the printed wiring board 120 through the first conductor 20 of the spacing tube 11. The wiring pattern 112B of the surface 110b side of the printed wiring board 110 is electrically connected to the wiring pattern 122B of the surface 120B side of the printed wiring board 120 through the washer 160A, the screw 150A, the second conductor 30 of the spacing tube 11, the screw 150B, and the washer 160B.

As described above, because two conductive paths are formed between the printed wiring board 110 and the printed wiring board 120 through the spacing tube 11, two different potentials may be transferred between the printed wiring board 110 and the printed wiring board 120. For example, a ground potential is transferred between the wiring pattern 112A and the wiring pattern 122A through the first conductor 20 and a power potential may be transferred between the wiring pattern 112B and the wiring pattern 122B through the second conductor 30.

According to the spacing tube 11 and the wiring board assembly structure 101 of the second exemplary embodiment, the printed wiring board 110 and the printed wiring board 120 may be connected with each other not only mechanically but also electrically while maintaining a predetermined spacing therebetween as in the first exemplary embodiment. In addition, because the spacing tube 11 includes the first conductor 20 and the second conductor 30 which are electrically separated from each other, two different potentials may be transferred between the printed wiring board 110 and the printed wiring board 120. In addition, the first conductor 20 and the second conductor 30 are electrically separated from each other in the radial direction of the spacing tube 11 and include the through hole 34 as a fastened portion to be engaged with the fastening members in the both ends thereof. Thus, positioning of the spacing tube 11 and the printed wiring boards 110 and 120 in the direction around the axis of the spacing tube 11 becomes needless as in the first exemplary embodiment.

In addition, the first conductor 20 is electrically connected to the wiring pattern of one surface of the printed wiring board, and the second conductor 30 is electrically connected to the wiring pattern of the other surface of the printed wiring board through the fastening members. Accordingly, the electrical connection of a wiring pattern formed on each surface of one printed wiring board and a wiring pattern formed on each surface of the other printed wiring board may be performed using one spacing tube 11.

In addition, because the spacing tube 11 according to the second exemplary embodiment is provided with the through hole 34 in the second conductor 30, the spacing tube 11 may also be attached to the printed wiring boards 110 and 120 using a screw 150C extending through the through hole 34 and the nut 151A, as illustrated in 10. Thus, when the through hole 34 is provided as the fastened portion, the printed wiring boards may be attached by various methods.

Third Exemplary Embodiment

Figure 11A:
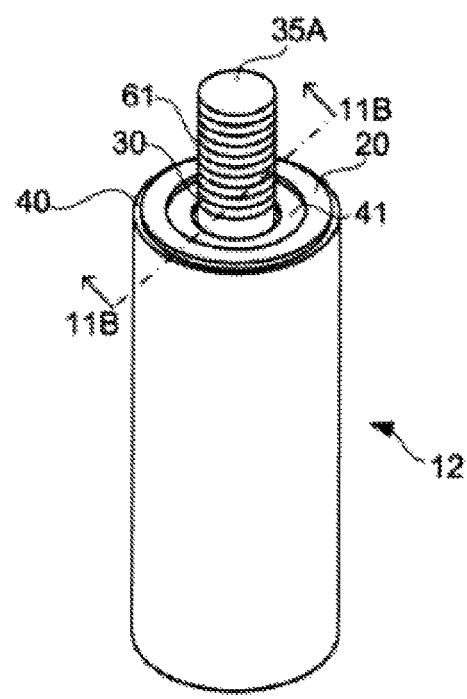
FIG. 11A is a perspective view of a spacing tube according to an exemplary embodiment of the present disclosure.
Figure 11B:
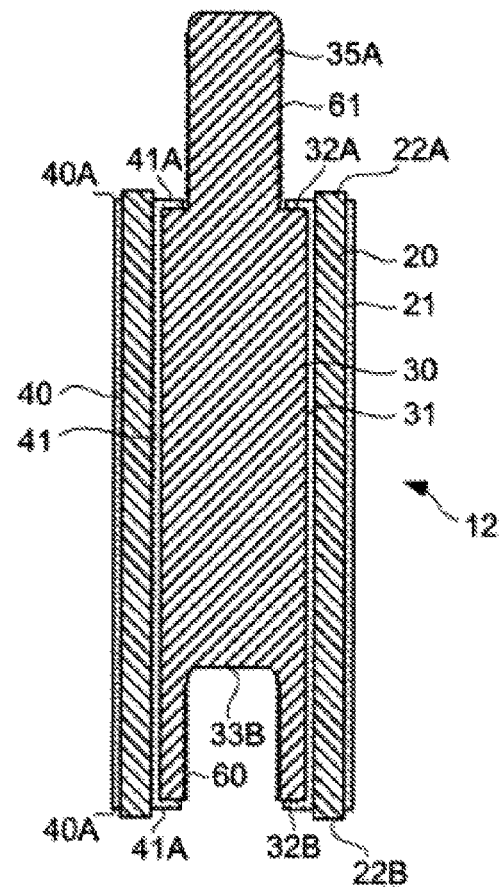
FIG. 11B is a cross-sectional view taken along the line 11B-11B in FIG. 11A.

FIG. 11A is a perspective view of a spacing tube 12 according to a third exemplary embodiment of the present disclosure. FIG. 11B is a cross-sectional view taken along the line 11B-11B in FIG. 11A.

The spacing tube 12 according to the third exemplary embodiment includes a first conductor 20, a second conductor 30, an insulator 40, and an insulator 41, similarly to the spacing tube 10 according to the first exemplary embodiment.

The spacing tube 12 according to the third exemplary embodiment includes, as a fastened portion to be engaged with a fastening member, a columnar protruding portion 35A which protrudes in a height direction of the spacing tube 12 of the second conductor 30 from an end face 32A at a central portion of one end face 32A. The protruding portion 35A also protrudes in relation to an end face 22A of the first conductor 20. Threads 61 are formed on the outer circumferential surface of the protruding portion 35A. The other end face of the second conductor 30 is provided with a recessed portion 33B as a fastened portion similarly to the spacing tube 10 according to the first exemplary embodiment, and threads 60 are formed on the inner circumferential surface of the recessed portion 33B. The first conductor 20 and the second conductor 30 are disposed such that the centers thereof coincide with each other, and electrically separated from each other. That is, the first conductor 20 and the second conductor 30 are electrically separated from each other in the radial direction of the spacing tube 12.

The configurations of the first conductor 20, the insulator 40, and the insulator 41 are the same as those of the spacing tube 10 according to the first exemplary embodiment. Thus, detailed descriptions on the components will be omitted. In addition, the spacing tube 12 is an example of a spacing tube in the present disclosure. The protruding portion 35A is an example of a protruding portion in the present disclosure. The recessed portion 33B is an example of a recessed portion in the present disclosure.

Figure 12:
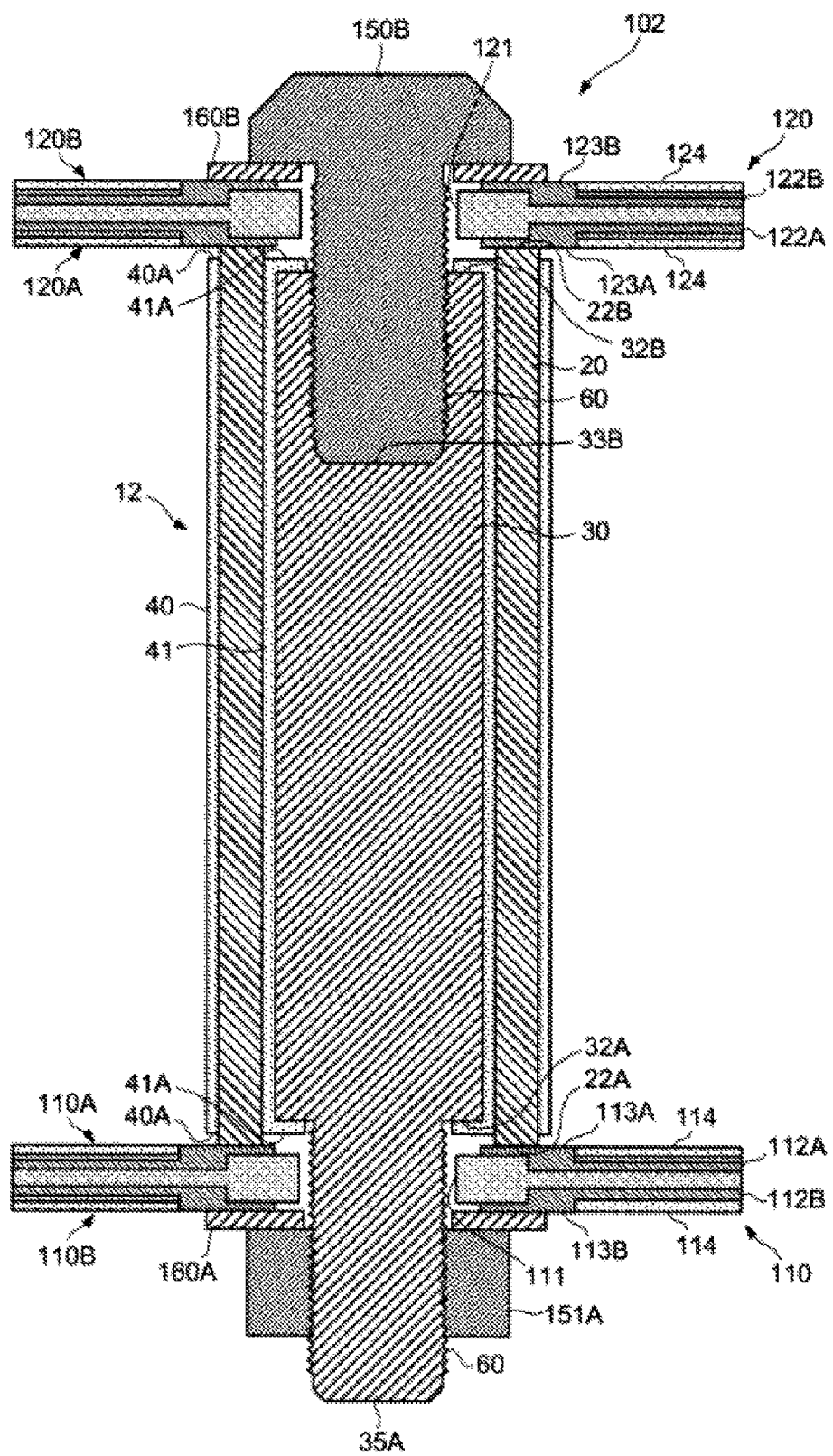
FIG. 12 is a cross-sectional view illustrating a partial configuration of a wiring board assembly structure according to an exemplary embodiment of the present disclosure.

FIG. 12 is a cross-sectional view illustrating a partial configuration of a wiring board assembly structure 102 according to the third exemplary embodiment of the present disclosure. The wiring board assembly structure 102 includes the aforementioned spacing tube 12, a printed wiring board 110 attached to one end of the spacing tube 12, and a printed wiring board 120 attached to the other end of the spacing tube 12. In addition, the wiring board assembly structure 102 is an example of a wiring board assembly structure in the present disclosure.

The printed wiring board 110 and the printed wiring board 120 are connected to be parallel to each other while maintaining a predetermined spacing therebetween through the spacing tube 12. In addition, although only one spacing tube 12 is indicated in the example illustrated in FIG. 12, the connection of the printed wiring board 110 and the printed wiring board may be performed using two or more spacing tubes 12. The configurations of the printed wiring board 110 and the printed wiring board 120 are the same as those in the first exemplary embodiment.

The protruding portion 35A of the second conductor 30 of the spacing tube 12 is inserted through the through hole 111 of the printed wiring board 110. The printed wiring board 110 is attached to one end of the spacing tube 12 by fastening a nut 151A to the protruding portion 35A which is inserted through the through hole 111 from the surface 110A side and protrudes from the surface 110B of the printed wiring board 110. The nut 151A is conductive.

A washer 160A is provided between the nut 151A and the surface 110B of the printed wiring board 110, and abutted on the electrode 113B. The washer 160A is conductive. That is, the second conductor 30 of the spacing tube 12 is electrically connected to the electrode 113B and the wiring pattern 112B provided at the surface 110B side of the printed wiring board 110 through the washer 160A and the nut 151A. In addition, the washer 160A is a member which is provided as needed in order to prevent the loosening of the nut 151A and may be omitted. When the washer 160A is not provided, the nut 151A is abutted on the electrode 113B.

The end face 22A of the first conductor 20 of the spacing tube 12 is abutted on the electrode 113A of the printed wiring board 110. That is, the first conductor 20 of the spacing tube 12 is electrically connected to the electrode 113A and the wiring pattern 112A provided at the surface 110A side of the printed wiring board 110. Because the end face 22A of the first conductor 20 protrudes in relation to the end face 40A of the insulator 40 and the end face 41A of the insulator 41, the contactability of the end face 22A of the first conductor 20 and the electrode 113A becomes better as compared to the case in which the end face 22A does not protrude. The second conductor 30 of the spacing tube 12 is not contacted with the electrode 113A.

The printed wiring board 120 is attached to the other end of the spacing tube 12 by a screw 150B which is inserted through the through hole 121 from the surface 120B side and fastened to the recessed portion 33B of the second conductor 30 of the spacing tube 12.

The end face 22B of the first conductor 20 of the spacing tube 12 is abutted on the electrode 123A of the printed wiring board 120. That is, the first conductor 20 of the spacing tube 12 is electrically connected to the electrode 123A and the wiring pattern 122A provided at the surface 120A side of the printed wiring board 120. Because the end face 22B of the first conductor protrudes in relation to the end face 40A of the insulator 40 and the end face 41A of the insulator 41, the contactability of the end face 22B of the first conductor 20 and the electrode 123A becomes better as compared to the case in which the end face 22B does not protrude. Meanwhile, the second conductor 30 of the spacing tube 12 is not contacted with the electrode 123A.

The screw 150B is inserted through the through hole 121 from the surface 120B side of the printed wiring board 120, and engaged with the threads 60 formed on the inner circumferential surface of the recessed portion 33B of the second conductor 30 of the spacing tube 12, thereby being fastened to the recessed portion 33B. The screw 150B is conductive. A washer 160B is provided between the screw 150B and the surface 120B of the printed wiring board 120, and abutted on the electrode 123B. The washer 160B is conductive. That is, the second conductor 30 of the spacing tube 12 is electrically connected to the electrode 123B and the wiring pattern 122B provided at the surface 120B side of the printed wiring board 120 through the washer 160B and the screw 150B. In addition, the washer 160B is a member which is provided as needed in order to prevent the loosening of the screw 150B and may be omitted. When the washer 160B is provided, the screw 150B is abutted on the electrode 123B.

As described above, the printed wiring board 110 and the printed wiring board 120 are connected not only mechanically but also electrically through the spacing tube 12. Specifically, the printed wiring board 120 is supported on the printed wiring board 110 through the spacing tube 12. In addition, the wiring pattern 112A of the surface 110A side of the printed wiring board 110 is electrically connected to the wiring pattern 122A at the surface 120A side of the printed wiring board 120 through the first conductor 20 of the spacing tube 12. The wiring pattern 112B at the surface 110B side of the printed wiring board 110 is electrically connected to the wiring pattern 122B of the surface 120B side of the printed wiring board 120 through the washer 160A, the nut 151A, the second conductor 30 of the spacing tube 12, the screw 150B, and the washer 160B.

As described above, because two conductive paths are formed between the printed wiring board 110 and the printed wiring board 120 through the spacing tube 12, two different potentials may be transferred between the printed wiring board 110 and the printed wiring board 120 through the spacing tube 12. For example, a ground potential may be transferred between the wiring pattern 112A and the wiring pattern 122A through the first conductor 20, and a power potential may be transferred between the wiring pattern 112B and the wiring pattern 122B through the second conductor 30.

According to the spacing tube 12 and the wiring board assembly structure 102 according to the third exemplary embodiment, the printed wiring board 110 and the printed wiring board 120 may be connected not only mechanically but also electrically while maintaining a predetermined spacing therebetween. In addition, because the spacing tube 12 includes the first conductor 20 and the second conductor 30 which are electrically separated from each other, two different potentials may be transferred between the printed wiring board 110 and the printed wiring board 120. In addition, the first conductor 20 and the second conductor 30 are electrically separated from each other in the radial direction of the spacing tube 12, and includes, as fastened portions to be fastened to fastening members, the protruding portion 35A and the recessed portion 33B, in the both ends of the second conductor 30. Thus, positioning of the spacing tube 12 and the printed wiring boards 110 and 120 in the direction around the axis of the spacing tube 12 becomes needless as in the first exemplary embodiment.

In addition, the first conductor 20 is electrically connected to the wiring pattern of one surface of the printed wiring board, and the second conductor 30 is electrically connected to the wiring pattern of the other surface of the printed wiring board through the fastening member. Accordingly, the electrical connection of a wiring pattern formed on each surface of one printed wiring board and a wiring pattern formed on each surface of the other printed wiring board may be performed through one spacing tube 12.

Fourth Exemplary Embodiment

Figure 13A:
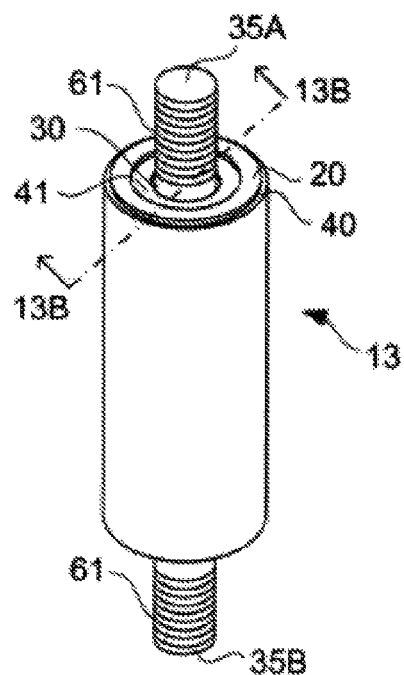
FIG. 13A is a perspective view of a spacing tube according to an exemplary embodiment of the present disclosure.
Figure 13B:
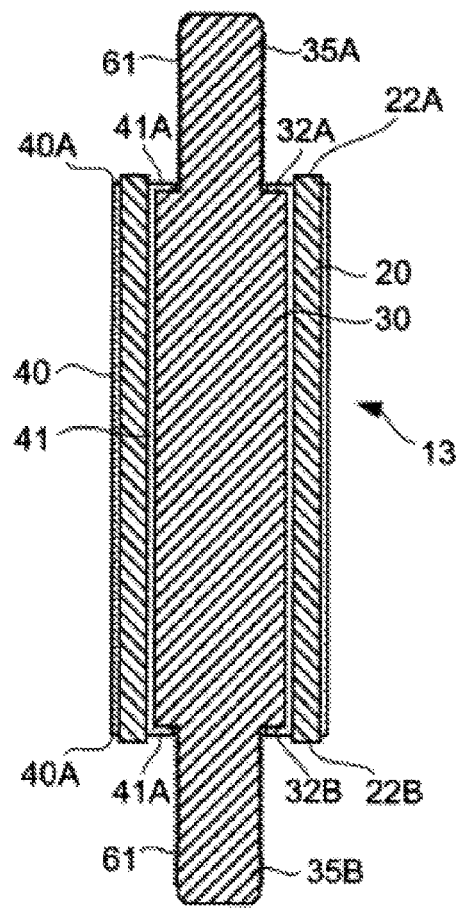
FIG. 13B is a cross-sectional view taken along the line 13B-13B in FIG. 13A.

FIG. 13A is a perspective view of a spacing tube 13 according to a fourth exemplary embodiment of the present disclosure, and FIG. 13B is a cross-sectional view taken along the line 13B-13B in FIG. 13A.

The spacing tube 13 according to the fourth exemplary embodiment includes a first conductor 20, a second conductor 30, an insulator 40, and an insulator 41 similarly to the spacing tube 10 according to the first exemplary embodiment.

The spacing tube 13 according to the fourth exemplary embodiment includes, as fastened portions to be engaged with fastening members, columnar protruding portions 35A and 35B protruding in the height direction of the spacing tube 13 from end faces 32A and 32B of the second conductor 30 at central portions of the end faces 32A and 32B of the second conductor 30. The protruding portion 35A also protrudes in relation to the end face 22A of the first conductor 20, and the protruding portion 35B also protrudes in relation to the end face 22B of the first conductor 20. Threads 61 are formed on outer circumferential surfaces of the protruding portions 35A and 35B. In addition, the protruding portions 35A and 35B are an example of a protruding portion in the present disclosure. The first conductor 20 and the second conductor 30 are disposed such that the centers thereof coincide with each other, and electrically separated from each other. That is, the first conductor 20 and the second conductor 30 are electrically separated from each other in the radial direction of the spacing tube 13.

The configurations of the first conductor 20, the insulator 40, and the insulator 41 are the same as those of the spacing tube 10 according to the first exemplary embodiment. Thus, detailed descriptions on these components will be omitted.

Figure 14:
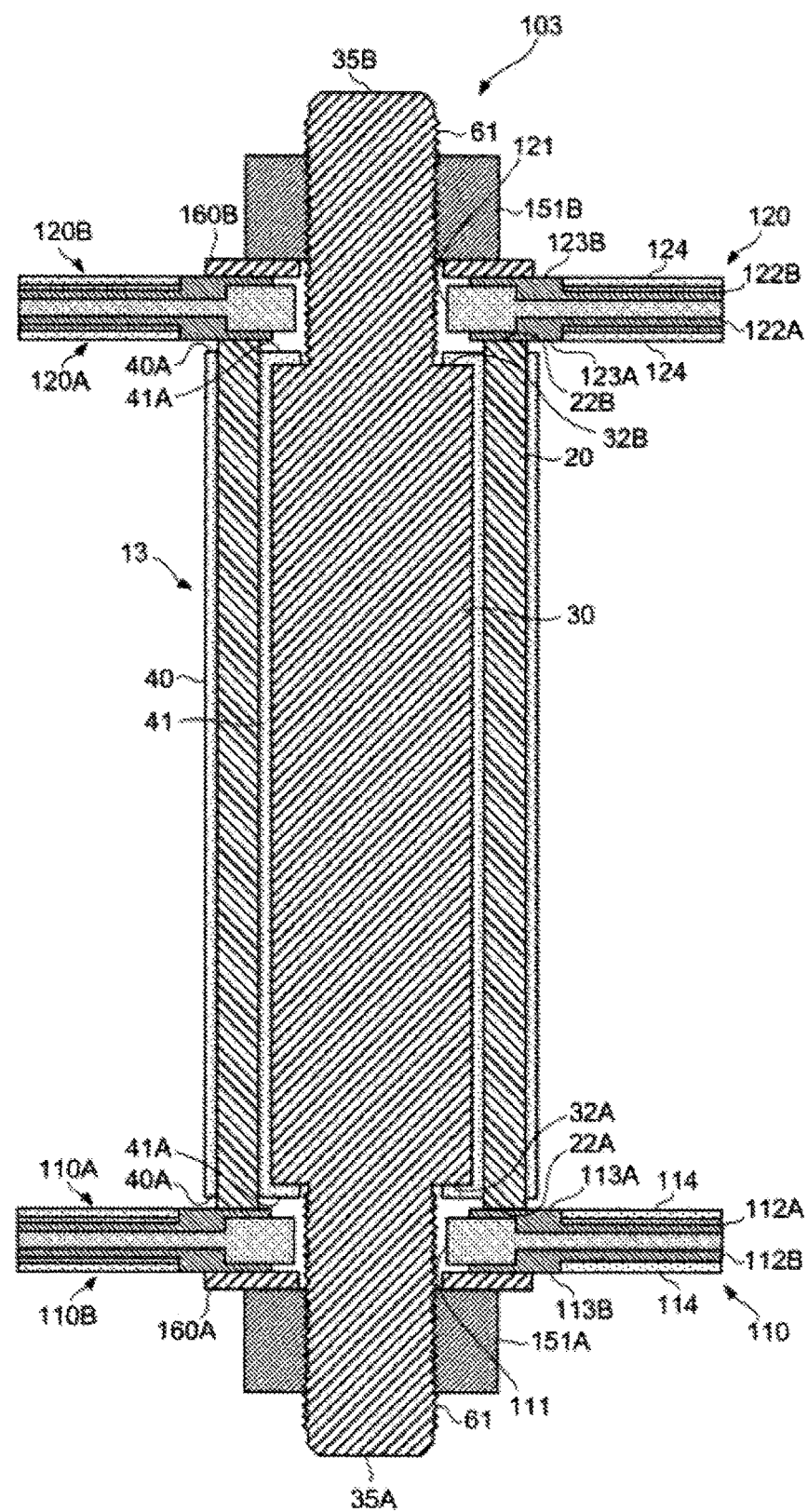
FIG. 14 is a cross-sectional view illustrating a partial configuration of a wiring board assembly structure according to an exemplary embodiment of the present disclosure.

FIG. 14 is a cross-sectional view illustrating a partial configuration of a wiring board assembly structure 103 according to the fourth exemplary embodiment of the present disclosure. The wiring board assembly structure 103 includes the aforementioned spacing tube 13, a printed wiring board 110 attached to one end of the spacing tube 13, and a printed wiring board 120 attached to the other end of the spacing tube 13. In addition, the wiring board assembly structure 103 is an example of wiring board assembly structures in the present disclosure.

The printed wiring board 110 and the printed wiring board 120 are connected to be parallel to each other while maintaining a predetermined spacing therebetween through the spacing tube 13. In addition, although only one spacing tube 13 is indicated in the example illustrated in FIG. 14, the connection of the printed wiring board 110 and the printed wiring board 12 may be performed using two or more spacing tubes 13. Further, the configurations of the printed wiring board 110 and the printed wiring board 120 are the same as those in the first exemplary embodiment.

The protruding portion 35A of the second conductor 30 of the spacing tube 13 is inserted through the through hole 111 of the printed wiring board 110. The printed wiring board 110 is attached to one end of the spacing tube 13 by fastening 151A to the protruding portion 35A which is inserted through the through hole 111 from a surface 110A side and protrudes from a surface 110б. The nut 151A is conductive.

A washer 160A is provided between the nut 151A and the surface 110б of the printed wiring board 110, and abutted on the electrode 113B. The washer 160A is conductive. That is, the second conductor 30 of the spacing tube 13 is electrically connected to the electrode 113B and the wiring pattern 112B provided at the surface 110б side of the printed wiring board 110 through the washer 160A and the 151A. In addition, the washer 160A is a member which is provided as needed in order to prevent the loosening of the nut 151A, and may be omitted. When the washer 160A is not provided, the nut 151A is abutted on the electrode 113B.

The end face 22A of the first conductor 20 of the spacing tube 13 is abutted on the electrode 113A of the printed wiring board 110. That is, the first conductor 20 of the spacing tube 13 is electrically connected to the electrode 113A and the wiring pattern 112A provided at the surface 110A side of the printed wiring board 110. Because the end face 22A of the first conductor 20 protrudes in relation to the end face 40A of the insulator 40 and the end face 41A of the insulator 41, the contactability of the end face 22A of the first conductor 20 and the electrode 113A becomes better as compared to the case in which the end face 22A does not protrude. The second conductor 30 of the spacing tube 13 is not contacted with the electrode 113A.

The protruding portion 35B of the second conductor 30 of the spacing tube 13 is inserted through the through hole 121 of the printed wiring board 120. The printed wiring board 120 is attached to the other end of the spacing tube 13 by fastening a nut 151B to the protruding portion 35B which is inserted through the through hole 121 from the surface 120A side and protrudes from the surface 120B. The nut 151B is conductive.

A washer 160B is provided between the nut 151B and the surface 120B of the printed wiring board 120 and abutted on the electrode 123B. The washer 160B is conductive. That is, the second conductor 30 of the spacing tube 13 is electrically connected to the electrode 123B and the wiring pattern 122B provided at the surface 120B side of the printed wiring board 120 through the washer 160B and the nut 151B. In addition, the washer 160B is a member which is provided as needed in order to prevent the loosening of the nut 151B and may be omitted. When the washer 160B is provided, the nut 151B is abutted on the electrode 123B.

The end face 22B of the first conductor 20 of the spacing tube 13 is abutted on the electrode 123A of the printed wiring board 120. That is, the first conductor 20 of the spacing tube 13 is electrically connected to the electrode 123A and the wiring pattern 122A is provided at the surface 120A side of the printed wiring board 120. Because the end face 22B of the first conductor 20 protrudes in relation to the end face 40A of the insulator 40 and the end face 41A of the insulator 41, the contactability of the end face 22B of the first conductor 20 and the electrode 123A becomes better as compared to the case in which the end face 22B does not protrude. The second conductor 30 of the spacing tube 13 is not contacted with the electrode 123A.

As described above, the printed wiring board 110 and the printed wiring board 120 are connected with each other not only mechanically but also electrically through the spacing tube 13. Specifically, the printed wiring board 120 is supported on the printed wiring board 110 through the spacing tube 13. The wiring pattern 112A of the surface 110A side of the printed wiring board 110 is electrically connected to the wiring pattern 122A of the surface 120A side of the printed wiring board 120 through the first conductor 20 of the spacing tube 13. The wiring pattern 112B of the surface 110B side of the printed wiring board 110 is electrically connected to the wiring pattern 122B of the surface 120B side of the printed wiring board 120 through the washer 160A, the nut 151A, the second conductor 30 of the spacing tube 13, the nut 151B, and the washer 160B.

As described above, because two conductive paths are formed between the printed wiring board 110 and the printed wiring board 120 through the spacing tube 13, two different potentials may be transferred between the printed wiring board 110 and the printed wiring board 120 through the spacing tube 13. For example, a ground potential may be transferred between the wiring pattern 112A and the wiring pattern 122A through the first conductor 20, and a power potential may be transferred between the wiring pattern 112B and the wiring pattern 122B through the second conductor 30.

According to the spacing tube 13 and the wiring board assembly structure 103 according to the fourth exemplary embodiment, the printed wiring board 110 and the printed wiring board 120 may be connected with each other not only mechanically but also electrically while maintaining a predetermined spacing therebetween. In addition, because the spacing tube 13 includes the first conductor 20 and the second conductor 30 which are electrically separated from each other, two different potentials may be transferred between the printed wiring board 110 and the printed wiring board 120. In addition, the first conductor 20 and the second conductor 30 are electrically separated from each other in the radial direction of the spacing tube 13, and includes, as fastened portions to be fastened to fastening members, the protruding portion 35A and 35B in the both ends of the second conductor 30. Thus, positioning of the spacing tube 13 and the printed wiring boards 110 and 120 in the direction around the axis of the spacing tube 13 becomes needless as in the first exemplary embodiment.

In addition, the first conductor 20 is electrically connected to a wiring pattern of one surface of a printed wiring board and the second conductor 30 is electrically connected to a wiring pattern of the other surface of the printed wiring board through a fastening member. Accordingly, the electrical connection of a wiring pattern formed on each surface of one printed wiring board and a wiring pattern formed on each surface of the other printed wiring board may be performed through one spacing tube 13. In addition, according to the spacing tube 13 of the present exemplary embodiment, when the wiring board assembly structure 103 is assembled, the protruding portions 35A and 35B of the spacing tube 13 are inserted through the through holes 111 and 121 of the printed wiring boards 110 and 120, and fastened by the nuts 151A and 151B. Thus, it may be said that it is superior in workability as compared to a case in which the positioning of a recessed portion of a spacing tube and through holes of printed wiring boards is performed, and then fastened by screws.

Fifth Exemplary Embodiment

Figure 15A:
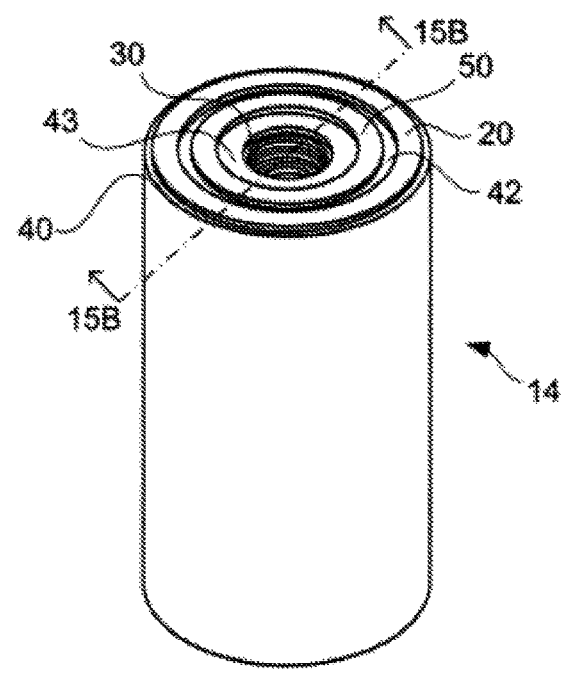
FIG. 15A is a perspective view of a spacing tube according to an exemplary embodiment of the present disclosure.
Figure 15B:
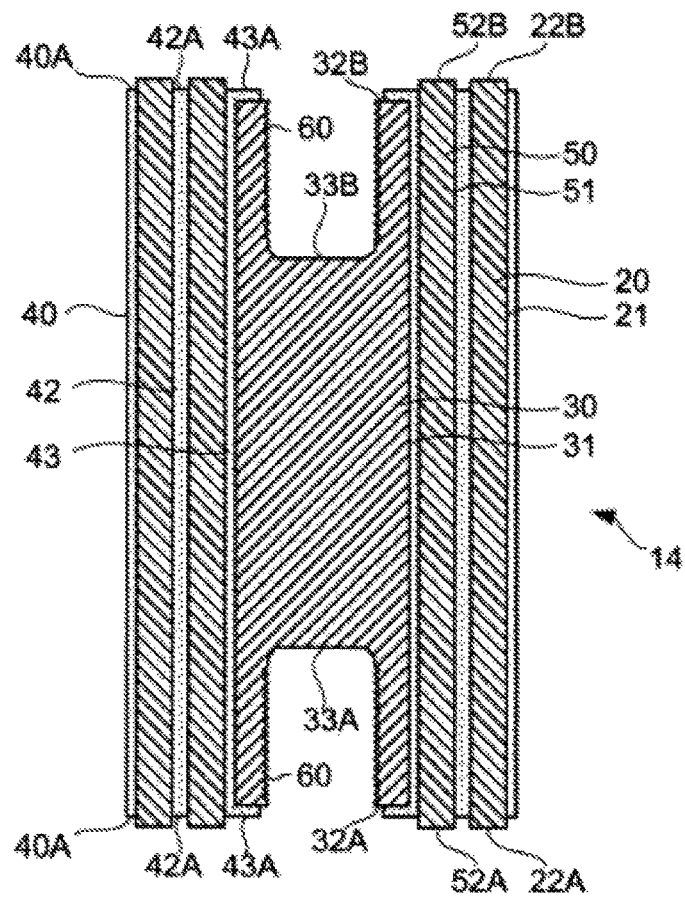
FIG. 15B is a cross-sectional view taken along the line 15B-15B in FIG. 15A.

FIG. 15A is a perspective view of a spacing tube 14 according to a fifth exemplary embodiment of the present disclosure, and FIG. 15B is a cross-sectional view taken along the line 15B-15B in FIG. 15A.

The spacing tube 14 according to the fifth exemplary embodiment further includes a third conductor 50 between the first conductor 20 and the second conductor 30. The configurations of the first conductor 20 and the second conductor 30 are the same as those of the spacing tube 10 according to the first exemplary embodiment. Thus, detailed descriptions on these components will be omitted. In addition, the spacing tube 14 is an example of spacing tubes in the present disclosure. The third conductor 50 is an example of third conductors in the present disclosure.

The third conductor 50 has a tubular (more specifically, cylindrical) external shape having a side face 51 and end faces 52A and 52B similarly to the first conductor 20 and is installed inside the first conductor 20. The first conductor 20, the second conductor 30, and the third conductor 50 are disposed such that the centers thereof coincide with each other. In addition, the first conductor 20, the second conductor 30, and the third conductor 50 are electrically separated from each other. That is, the first conductor 20, the second conductor 30, and the third conductor 50 are electrically separated from each other in the radial direction of the spacing tube 14.

An insulator 42 is provided between the first conductor 20 and the third conductor 50 such that the first conductor 20 and the third conductor 50 are not contacted with each other. An insulator 43 is provided between the third conductor 50 and the second conductor 30 such that the third conductor 50 and the second conductor 30 are not contacted with each other. In addition, the insulator 43 partially covers the end faces 32A and 32B of the second conductor 30. The insulator 40 entirely covers the side face 21 of the first conductor 20.

The end faces 22A and 22B of the first conductor 20 and the end faces 52A and 52B of the third conductor 50 protrude in relation to the end faces 40A, 42A and 43A of the insulators 40, 42 and 43 and protrude in relation to the end faces 32A and 32B of the second conductor 3 and form annular ring-shaped electrical connection portions.

Figure 16:
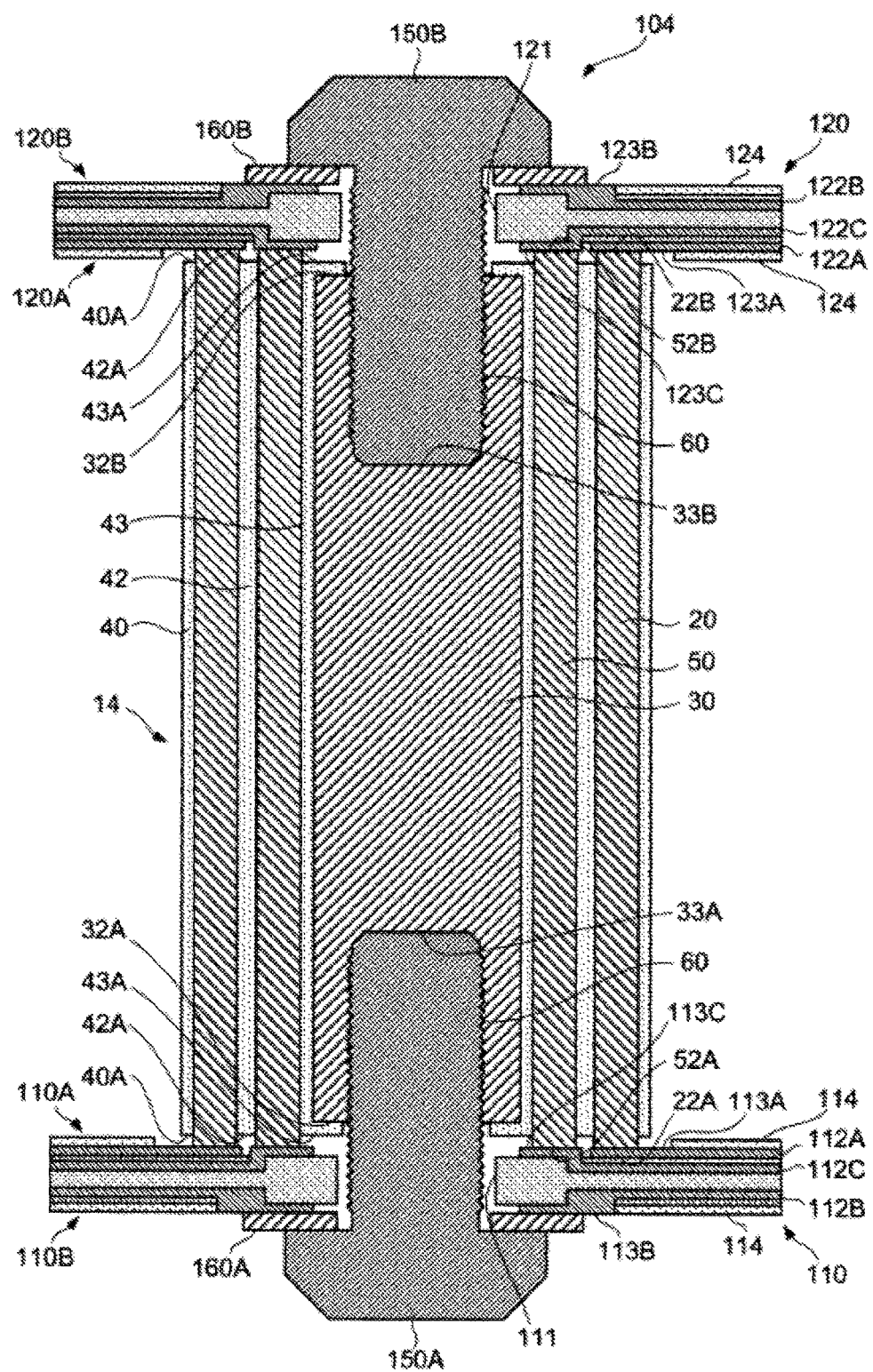
FIG. 16 is a cross-sectional view illustrating a partial configuration of a wiring board assembly structure according to an exemplary embodiment of the present disclosure.

FIG. 16 is a cross-sectional view illustrating a partial configuration of a wiring board assembly structure 104 according to the fifth exemplary embodiment of the present disclosure. The wiring board assembly structure 104 includes the aforementioned spacing tube 14, a printed wiring board 110 attached to one end of the spacing tube 14, and a printed wiring board 120 attached to the other end of the spacing tube 14. In addition, the wiring board assembly structure 104 is an example of wiring board assembly structure in the present disclosure.

The printed wiring board 110 and the printed wiring board 120 are connected to be parallel to each other while maintaining a predetermined spacing therebetween through the spacing tube 14. In addition, although only one spacing tube 14 is indicated in the example illustrated in FIG. 16, the connection of the printed wiring board 110 and the printed wiring board 120 may be performed using two or more spacing tubes 14.

The printed wiring board 110 includes a through hole 111 at an attachment position of the spacing tube 14. The printed wiring board 110 is attached to one end of the spacing tube 14 by a screw 150A which is inserted through the through hole 111 from the surface 110B side and fastened to the recessed portion 33A of the second conductor 30 of the spacing tube 14.

The printed wiring board 110 includes wiring patterns 112A and 112C formed at the surface 110A side where the spacing tube 14 is attached, and a wiring pattern 112B at the surface 110B side where the screw 150A is attached. The wiring pattern 112C includes an electrode 113C exposed to the surface at least in the outer circumferential portion of the through hole 111. In addition, the wiring pattern 112A includes an electrode 113A exposed to the surface outside the electrode 113C. The wiring patterns 112A and 112C are covered with a resist 114 except for the electrodes 113A and 113C. The wiring pattern 112B includes an electrode 113B exposed to the surface at least in the outer circumferential portion of the through hole 111 and the wiring pattern 112B is covered with the resist 114 except for the electrode 113B.

The end face 22A of the first conductor 20 of the spacing tube 14 is abutted on the electrode 113A of the printed wiring board 110. That is, the first conductor 20 of the spacing tube 14 is electrically connected to the electrode 113A and the wiring pattern 112A provided at the surface side 110A of the printed wiring board 110. The end face 52A of the third conductor 50 of the spacing tube 14 is abutted on the electrode 113C of the printed wiring board 110. That is, the third conductor 50 of the spacing tube 14 is electrically connected to the electrode 113C and the wiring pattern 112C provided at the surface side 110A of the printed wiring board 110. Because the end face 22A of the first conductor 20 protrudes in relation to the end faces 40A, 42A and 43A of the insulators 40, 42 and 43, the contactability of the end face 22A of the first conductor 20 and the electrode 113A becomes better as compared to the case in which the end face 22A does not protruded. In addition, because the end face 52A of the third conductor 50 protrudes in relation to the end face 40A, 42A and 43A of the insulators 40, 42 and 43, the contactability of the end face 52A of the third conductor 50 and the electrode 113C becomes better as compared to the case in which the end face 52A does not protrude. Meanwhile, the second conductor 30 of the spacing tube 14 is not contacted with the electrodes 113A and 113C.

The screw 150A is inserted through the through hole 111 from the surface side 110B of the printed wiring board 110, and engaged with the threads 60 formed on the inner circumferential surface of the recessed portion 33A of the second conductor 30 of the spacing tube 14, thereby being fastened to the recessed portion 33A. The screw 150A is conductive. A washer 160A is provided between the screw 150A and the surface 110B of the printed wiring board 110 and abutted on the electrode 113B. The washer is conductive. That is, the second conductor 30 of the spacing tube 14 is electrically connected to the electrode 113B and the wiring pattern 112B provided at the surface side 110B of the printed wiring board 110 through the washer 160A and the screw 150A. In addition, the washer 160A is a member which is provided as needed in order to prevent the loosening of the screw 150A and may be omitted. When the washer 160A is not provided, the screw 150A is abutted on the electrode 113B.

The printed wiring board 120 includes a through hole 121 at an attachment position of the spacing tube 14 similarly to the aforementioned printed wiring board 110. The printed wiring board 120 is attached to the other end of the spacing tube 14 by a screw 150B which is inserted through the through hole 121 from the surface 120B side and fastened to the recessed portion 33B of the second conductor 30 of the spacing tube 14.

The printed wiring board 120 includes wiring patterns 122A and 122C formed at the surface 120A side where the spacing tube 14 is attached, and a wiring pattern 122B formed at the surface 120B side where the screw 150B is attached. The wiring pattern 122C includes an electrode 123C exposed to the surface at least in the outer circumferential portion of the through hole 121. The wiring pattern 122A includes an electrode 123A exposed to the surface outside the electrode 123C. The wiring patterns 122A and 122C are covered with the resist 124 except for the electrode 123A and 123C. the wiring pattern 122B includes an electrode 123B exposed to the surface at least in the outer circumferential portion of the through hole 121, and the wiring pattern 122B is covered with the resist 124 except for the electrode 123B.

The end face 22B of the first conductor 20 of the spacing tube 14 is abutted on the electrode 123A of the printed wiring board 120. That is, the first conductor 20 of the spacing tube 14 is electrically connected to the electrode 123A and the wiring pattern 122A provided at the surface 120A side of the printed wiring board 120. The end face 52B of the third conductor 50 of the spacing tube 14 is abutted on the electrode 123C of the printed wiring board 120. That is, the third conductor 50 of the spacing tube 14 is electrically connected to the electrode 123C and the wiring pattern 122C provided at the surface 120A side of the printed wiring board 120. Because the end face 22B of the first conductor 20 protrudes in relation to the end faces 40A, 42A and 43A of the insulators 40, 42 and 43, the contactability of the end face 22B of the first conductor 20 and the electrode 123A becomes better as compared to the case in which the end face 22B does not protrude. In addition, because the end face 52B of the third conductor 50 protrudes in relation to the end face 40A, 42A and 43A of the insulators 40, 42 and 43, the contactability of the end face 52B of the third conductor 50 and the electrode 123C becomes better as compared to the case in which the end face 52B does not protrude. Meanwhile, the second conductor 30 of the spacing tube 14 is not contacted with the electrodes 123A and 123C.

The screw 150B is inserted through the through hole 121 from the surface 120B side of the printed wiring board 120, and engaged with the threads 60 formed on the inner circumferential surface of the recessed portion 33B of the second conductor 30 of the spacing tube 14, thereby being fastened to the recessed portion 33B. The screw 150B is conductive. A washer 160B is provided between the screw 150B and the surface 120B of the printed wiring board 120 and abutted on the electrode 123B. The washer 160B is conductive. That is, the second conductor 30 of the spacing tube 14 is electrically connected to the electrode 123B and the wiring pattern 122B provided at the surface 110B side of the printed wiring board 120 through the washer 160B and the screw 150B. In addition, the washer 160B is a member which is provided as needed in order to prevent the loosening of the screw 150B and may be omitted. When the washer 160B is not provided, the screw 150B is abutted on the electrode 123B.

As described above, the printed wiring board 110 and the printed wiring board 120 are connected not only mechanically but also electrically through the spacing tube 14. Specifically, the printed wiring board 120 is supported on the printed wiring board 110 through the spacing tube 14. In addition, the wiring pattern 112A of the surface 110A side of the printed wiring board 110 is electrically connected to the wiring pattern 122A of the printed wiring board 120 through the first conductor 20 of the spacing tube 14. In addition, the wiring pattern 112C of the surface 110A side of the printed wiring board 110 is electrically connected to the wiring pattern 122C of the surface 120A side of the printed wiring board 120 through the third conductor 50 of the spacing tube 14. The wiring pattern 112B of the surface 110B side of the printed wiring board 110 is electrically connected to the wiring pattern 122B of the surface 120B side of the printed wiring board 120 through the washer 160A, the screw 150A, the second conductor 30 of the spacing tube 14, the screw 150B, and the washer 160B.

As described above, because three conductive paths are formed between the printed wiring board 110 and the printed wiring board 120 through the spacing tube 14, three different potentials may be transferred between the printed wiring board 110 and the printed wiring board 120 through the spacing tube 14. For example, a first power potential may be transferred between the wiring pattern 112A and the wiring pattern 122A through the first conductor 20, and a second power potential may be transferred between the wiring pattern 112C and the wiring pattern 122C through the third conductor 50. Further, a ground potential may be transferred between the wiring pattern 112B and the wiring pattern 122B through the second conductor 30.

According to the spacing tube 14 and the wiring board assembly structure 104 of the fifth exemplary embodiment, the printed wiring board 110 and the printed wiring board 120 may be connected with each other not only mechanically but also electrically while maintaining a predetermined spacing therebetween. In addition, because the spacing tube 14 includes the first conductor 20, the second conductor 30, and the third conductor 50 which are electrically separated from each other, three different potentials may be transferred between the printed wiring board 110 and the printed wiring board 120. In addition, the first conductor 20, the second conductor 30, and the third conductor 50 are electrically separated from each other in the radial direction of the spacing tube 14, and include, as fastened portions to be fastened to fastening members, the recessed portions 33A and 33B in the both ends of the second conductor 30. Thus, the positioning of the spacing tube 14 and the printed wiring boards 110 and 120 in the direction around the axis of the spacing tube 14 becomes needless as in the first exemplary embodiment.

In addition, the first conductor 20 and the third conductor 50 are electrically connected on the wiring pattern on one surface of each printed wiring board and the second conductor 30 is electrically connected to the wiring pattern on the other surface of the printed wiring through a fastening member. Accordingly, the electrical connection of the wiring pattern formed on each surface of one printed wiring board and the wiring pattern formed on each surface of the other printed wiring board may be performed through one spacing tube 14.

Further, although the present exemplary embodiment exemplifies a configuration in which the second conductor 30 of the spacing tube 14 includes, as fastened portions, the recessed portions 33A and 33B, the configurations of the second conductors 30 in the spacing tubes 11, 12 and 13 according to the second to the fourth exemplary embodiments may be applied as well. In addition, although the third conductor 50 is provided between the first conductor 20 and the second conductor 30 in the present exemplary embodiment, the third conductor 50 may also be provided outside the first conductor 20. Further, two electrically separated tubular conductors may be provided between the first conductor 20 and the second conductor 30 or outside the first conductor 20.

Sixth Exemplary Embodiment

Figure 17:
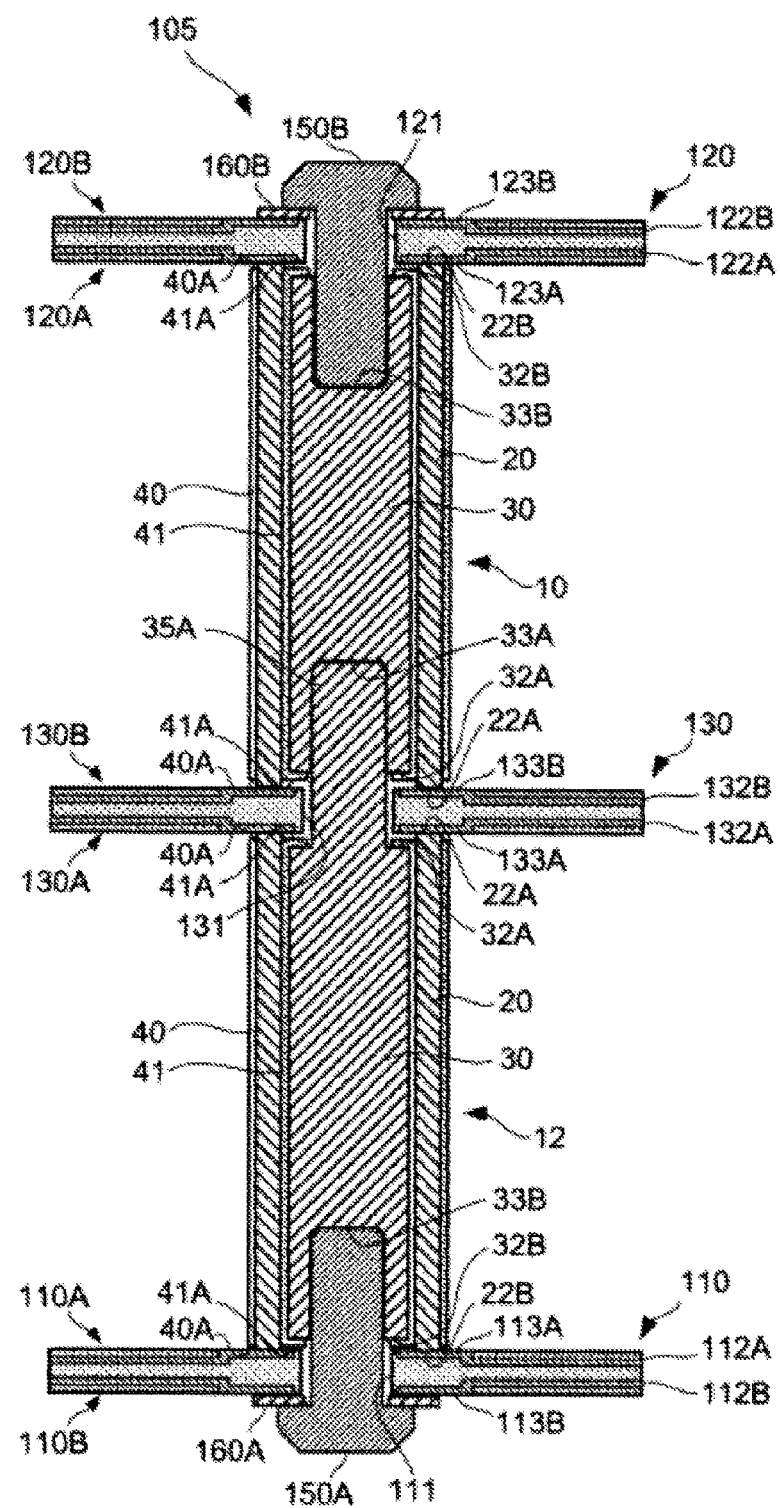
FIG. 17 is a cross-sectional view illustrating a partial configuration of a wiring board assembly structure according to an exemplary embodiment of the present disclosure.

FIG. 17 is a cross-sectional view illustrating a partial configuration of a wiring board assembly structure 105 according to a sixth exemplary embodiment of the present disclosure. The wiring board assembly structure 105 includes a printed wiring board 110 attached to one end of the spacing tube 12 according to the third exemplary embodiment, and a printed wiring board 120 attached to one end of the spacing tube 10 according to the first exemplary embodiment.

In addition, the wiring board assembly structure 105 includes a printed wiring board 130 sandwiched between the spacing tube 10 and the spacing tube 12. The wiring board assembly structure 105 is an example of wiring board assembly structures in the present disclosure. The spacing tube 12 is an example of first spacing tubes in the present disclosure and the spacing tube 10 is an example of second spacing tubes in the present disclosure. The first conductor 20 of the spacing tube 12 is an example of first conductors in the present disclosure, and the second conductor 30 of the spacing tube 12 is an example of second conductors in the present disclosure. The first conductor 20 of the spacing tube 10 is an example of third conductors in the present disclosure, and the second conductor 30 of the spacing tube 10 is an example of fourth conductors in the present disclosure. The printed wiring board 110 is an example of first wiring boards in the present disclosure, and the printed wiring board 120 is an example of a second wiring board in the present disclosure. In addition, the printed wiring board 130 is an example of a third wiring board in the present disclosure.

The printed wiring board 110 is attached to one end of the spacing tube 12 by a screw 150A which is inserted through the through hole 111 from the surface 110B side and fastened to the recessed portion 33B of the second conductor 30 of the spacing tube 12.

The end face 22B of the first conductor 20 of the spacing tube 12 is abutted on the electrode 113A of the printed wiring board 110. That is, the first conductor 20 of the spacing tube 12 is electrically connected to the wiring pattern 112A provided at the surface 110A side of the printed wiring board 110. Because the end face 22B of the first conductor 20 of the spacing tube 12 protrudes in relation to the end face 40A of the insulator 40 and the end face 41A of the insulator 41, the contactability of the end face 22B of the first conductor 20 and the electrode 113A becomes better as compared to the case in which the end face 22B does not protrude. Meanwhile, the second conductor 30 of the spacing tube 12 is not contacted with the electrode 113A.

A screw 150A is inserted through the through hole 111 from the surface 110B side of the printed wiring board 110, and fastened to the recessed portion 33B of the second conductor 30 of the spacing tube 12. The screw 150A is conductive. A washer 160A is provided between the screw 150A and the surface 110B of the printed wiring board 110 and abutted on the electrode 113B. That is, the second conductor 30 of the spacing tube 12 is electrically connected to the electrode 113B and the wiring pattern 112B which is provided at the surface 110B side of the printed wiring board 110 through the washer 160A and the screw 150A. In addition, the washer 160A is a member which is provided as needed in order to prevent the loosening of the screw 150A and may be omitted. When the washer 160A is not provided, the screw 150A is abutted on the electrode 113B.

The protruding portion 35A of the spacing tube 12 is inserted through the through hole 131 of the printed wiring board 130 from the surface 130A side. The protruding portion 35A of the spacing tube 12 which protrudes from the surface 130B of the printed wiring board 130 is fastened to the recessed portion 33A of the second conductor 30 of the spacing tube 10. The printed wiring board 130 is sandwiched between the spacing tube 12 and the spacing tube 10 which are connected with each other.

The end face 22A of the first conductor 20 of the spacing tube 12 is abutted on the electrode 133A of the printed wiring board 130. That is, the first conductor 20 of the spacing tube 12 is electrically connected to the electrode 133A and the wiring pattern 132A provided at the surface 130A side of the printed wiring board 130. Because the end face 22A of the first conductor 20 protrudes in relation to the end face 40A of the insulator 40 and the end face 41A of the insulator 41, the contactability of the end face 22A of the first conductor 20 and the electrode 133A becomes better as compared to the case in which the end face 22A does not protrude. The second conductor 30 of the spacing tube 12 is not contacted with the electrode 133A.

The end face 22A of the first conductor 20 of the spacing tube 10 connected to the spacing tube 12 is abutted on the electrode 133B of the printed wiring board 130. That is, the first conductor 20 of the spacing tube 10 is electrically connected to the electrode 133B and the wiring pattern 132B which are provided at the surface 130B side of the printed wiring board 130. Because the end face 22A of the first conductor 20 protrudes in relation to the end face 40A of the insulator 40 and the end face 41A of the insulator 41, the contactability of the end face 22A of the first conductor 20 and the electrode 133B becomes better as compared to the case in which the end face 22A does not protrude. The second conductor 30 of the spacing tube 10 is not contacted with the electrode 133B.

The printed wiring board 120 is attached to one end of the spacing tube 10 by a screw 150B which is inserted through the through hole 121 from the surface 120B side and fastened to the recessed portion 33B of the second conductor 30 of the spacing tube 10.

The end face 22B of the first conductor 20 of the spacing tube 10 is abutted on the electrode 123A of the printed wiring board 120. That is, the first conductor 20 of the spacing tube 10 is electrically connected to the electrode 123A and the wiring pattern 122A which are provided at the surface 120A side of the printed wiring board 120. Because the end face 22B of the first conductor 20 protrudes in relation to the end face 40A of the insulator 40 and the end face 41A of the insulator 41, the contactability of the end face 22B of the first conductor 20 and the electrode 123A becomes better as compared to the case in which the end face 22B does not protrude. Meanwhile, the second conductor 30 of the spacing tube 10 is not contacted with the electrode 123A.

The screw 150B is inserted through the through hole 121 from the surface 120B side of the printed wiring board 120, and fastened to the recessed portion 33B of the second conductor 30 of the spacing tube 10. The screw 150B is conductive. A washer 160B is provided between the screw 150B and the surface 120B of the printed wiring board 120, and abutted on the electrode 123B. The washer 160B is conductive. That is, the second conductor 30 of the spacing tube 10 is electrically connected to the electrode 123B and wiring pattern 122B which are provided at the surface 120B side of the printed wiring board 120, through the washer 160B and the screw 150B. In addition, the washer 160B is a member which is provided as needed in order to prevent the loosening of the screw 150B and may be omitted. When the washer 160B is not provided, the screw 150B is abutted on the electrode 123B.

As described above, the printed wiring boards 110, 120 and 130 are connected with each other not only mechanically but also electrically through the spacing tube 10 and the spacing tube 12. Specifically, the printed wiring board 130 is supported on the printed wiring board 110 through the spacing tube 12, and the printed wiring board 120 is supported on the printed wiring board 130 through the spacing tube 10. In addition, the wiring pattern 112A of the surface 110A side of the printed wiring board 110 is electrically connected to the wiring pattern 132A of the surface 130A side of the printed wiring board 130 through the first conductor 20 of the spacing tube 12. The wiring pattern 112B of the surface 110B side of the printed wiring board 110 is electrically connected to the wiring pattern 122B of the surface 120B side of the printed wiring board 120 through the washer 160A, the screw 150A, the second conductors 30 of the spacing tubes 12 and 10, the screw 150B, and the washer 160B. Further, the wiring pattern 132B of the surface 130B side of the printed wiring board 130 is electrically connected to the wiring pattern 122A of the surface 120A side of the printed wiring board 120 through the first conductor 20 of the spacing tube 10.

For example, a first power potential may be transferred between the wiring patterns 112A and 132A through the first conductor 20 of the spacing tube 12, and a second power potential may be transferred between the wiring patterns 132B and 122A through the first conductor 20 of the spacing tube 10. In addition, a ground potential may be transferred between the wiring patterns 112B and 122B through the second conductor 30 of the spacing tube 12 and the second conductor 30 of the spacing tube 10.

According to the wiring board assembly structure 105 of the sixth exemplary embodiment, the same effects as those of the wiring board assembly structures 100 to 104 in the first to fifth exemplary embodiments may be obtained. In addition, when the spacing tube 10 and the spacing tube 12 are connected with each other to be used, three or more printed wiring boards may be included in the wiring board assembly structure.

Further, in the wiring board assembly structure 105 of the present exemplary embodiment, the spacing tube 11 according to the second exemplary embodiment or the spacing tube 12 according to the third exemplary embodiment may be used instead of the spacing tube 10. In addition, in the wiring board assembly structure 105 according to the present exemplary embodiment, the spacing tube 13 according to the fourth exemplary embodiment may also be used instead of the spacing tube 12. Moreover, when the spacing tubes 10, 11, 12, 13 and 14 are properly connected with each other, four or more printed wiring boards may be connected with each other.

Seventh Exemplary Embodiment

Figure 18A:
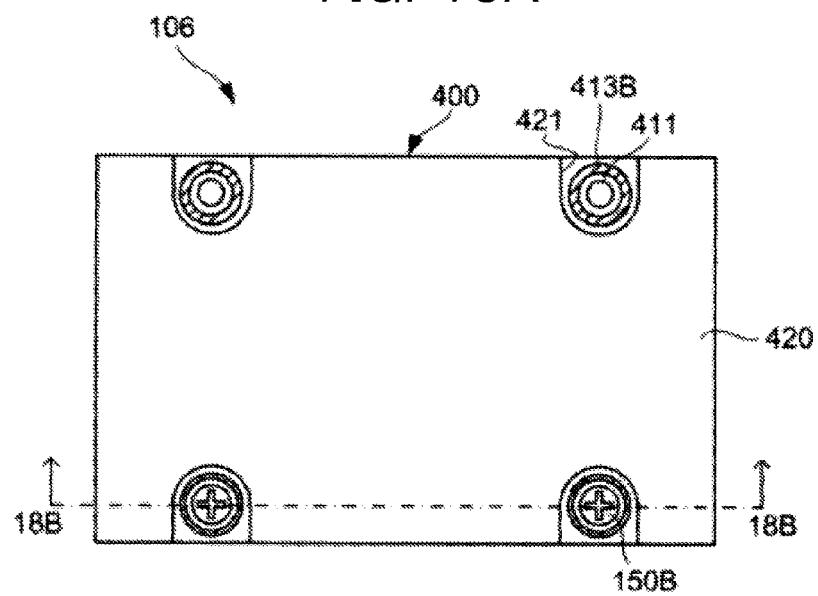
FIG. 18A is a top plan view of a wiring board assembly structure according to an exemplary embodiment of the present disclosure.
Figure 18B:
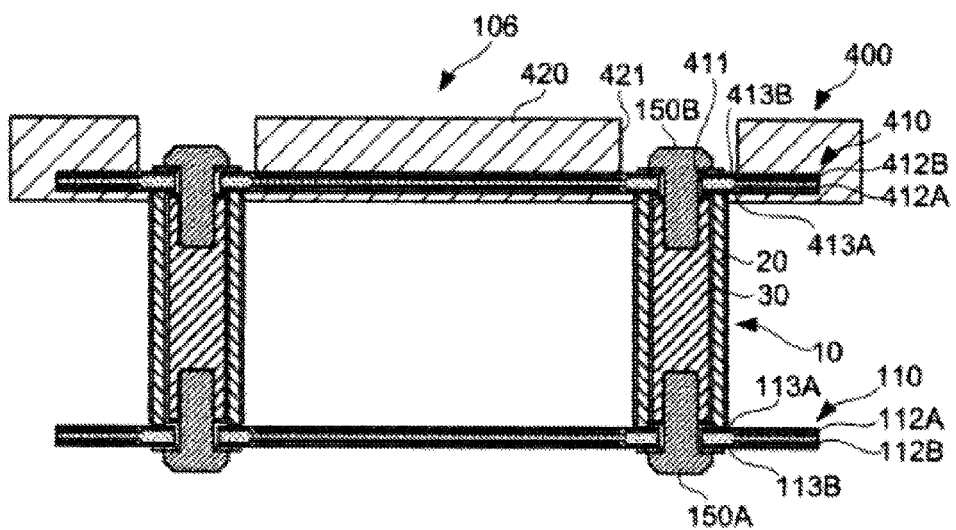
FIG. 18B is a cross-sectional view taken along the line 18B-18B in FIG. 18A.

FIG. 18A is a top plan view of a wiring board assembly 106 according to a seventh exemplary embodiment of the present disclosure, and FIG. 18B is a cross-sectional view taken along the line 18B-18B in FIG. 18A.

The wiring board assembly structure 106 includes a printed wiring board 110, an optical module 400, and a plurality of spacing tubes 10 which is provided therebetween. The optical module 400 is a component of an optical signal transceiver in which elements required for transmission/reception of an optical signal such as a transmission laser diode, a reception photodiode, and a wavelength division multiplexing filter are integrated.

The optical module 400 includes a printed wiring board 410 on which the aforementioned elements required for transmission/reception of an optical signal are mounted, and a sealing unit 420 that seals the printed wiring board 410. The printed wiring board 410 includes a wiring pattern 412A and electrodes 413A formed at one surface side, and a wiring pattern 412B and an electrode 413B formed at the other surface side, similarly to the printed wiring board 110. In addition, the printed wiring board 410 includes through holes 411 at attachment positions of the spacing tubes 10. The electrodes 413A are 413B extends in the outer circumferential surfaces of the through holes 411. The sealing unit 420 includes notches 421 at the opposite side to the spacing tubes 10 and corresponding to the attachment positions of the spacing tubes 10.

The through holes 411 and the electrodes 413B are exposed in the notches 421. In addition, the sealing unit 420 also includes notches at the attachment surface side of the spacing tubes 10, and the through holes 411 and the electrodes 413A are exposed through the corresponding notches. The configurations of the spacing tube 10 and the printed wiring board 110 are the same as those of the wiring board assembly structure 100 according to the first exemplary embodiment. Thus, detailed descriptions thereof will be omitted. In addition, the wiring board assembly structure 106 is an example of a wiring board assembly structure in the present disclosure. The printed wiring board 110 is an example of a first wiring board in the present disclosure and the printed wiring board 410 is an example of a second wiring board in the present disclosure.

The electrical and mechanical connection aspect of the printed wiring board 410 and the printed wiring board 110 through the spacing tubes 10 are the same as the connection aspect of the printed wiring board 110 and the printed wiring board 120 through the spacing tube 10 in the wiring board assembly structure 100 according to the aforementioned first exemplary embodiment. The optical module 400 is attached to the spacing tubes 10 by screws 150B which are inserted through the through holes 411 exposed in the notches 421 of the sealing unit 420 and fastened to the second conductors 30 of the spacing tubes 10.

For example, power is supplied to the optical module 400 from the printed wiring board 110 through the spacing tubes 10. Specifically, when the wiring pattern 412B of the printed wiring board 410 is connected to the wiring pattern 112B of the printed wiring board 110 through the screws 150B, the second conductors 30 of the spacing tubes 10 and the screws 150A, a power potential is transferred to the wiring pattern 412B from the printed wiring board 110. Meanwhile, when the wiring pattern 412A of the printed wiring board 410 is connected to the wiring pattern 112A of the printed wiring board 110 through the first conductors 20 of the spacing tubes 10, a ground potential is transferred to the wiring pattern 412A from the printed wiring board 110.

According to the wiring board assembly structure 106 of the seventh exemplary embodiment, the printed wiring board 110 and the optical module 400 may be connected with each other not only mechanically but also electrically while maintaining a predetermined spacing therebetween. In addition, because each of the spacing tubes 10 includes the first conductor 20 and the second conductor 30 which are electrically separated from each other, two different potentials may be transferred between the printed wiring board 110 and the optical module 400 per one spacing tube. Further, the first conductor 20 and the second conductor 30 are electrically separated from each other in the radial direction of each of the spacing tubes 10, and include, fastened portions to be fastened to fastening members, the recessed portions 33A and 33B at both ends of the second conductor 30. Thus, positioning of each spacing tube 10 and the printed wiring boards 110 and 410 in the direction around the axis of the spacing tube 10 becomes needless.

Although the present exemplary embodiment exemplifies a case in which the printed wiring board 110 and the optical module 400 are connected with each other using the spacing tubes 10 according to the first exemplary embodiment, the spacing tubes 11 to 14 according to the second to fifth exemplary embodiments may be used instead of the spacing tubes 10.

Eighth Exemplary Embodiment

Figure 19:
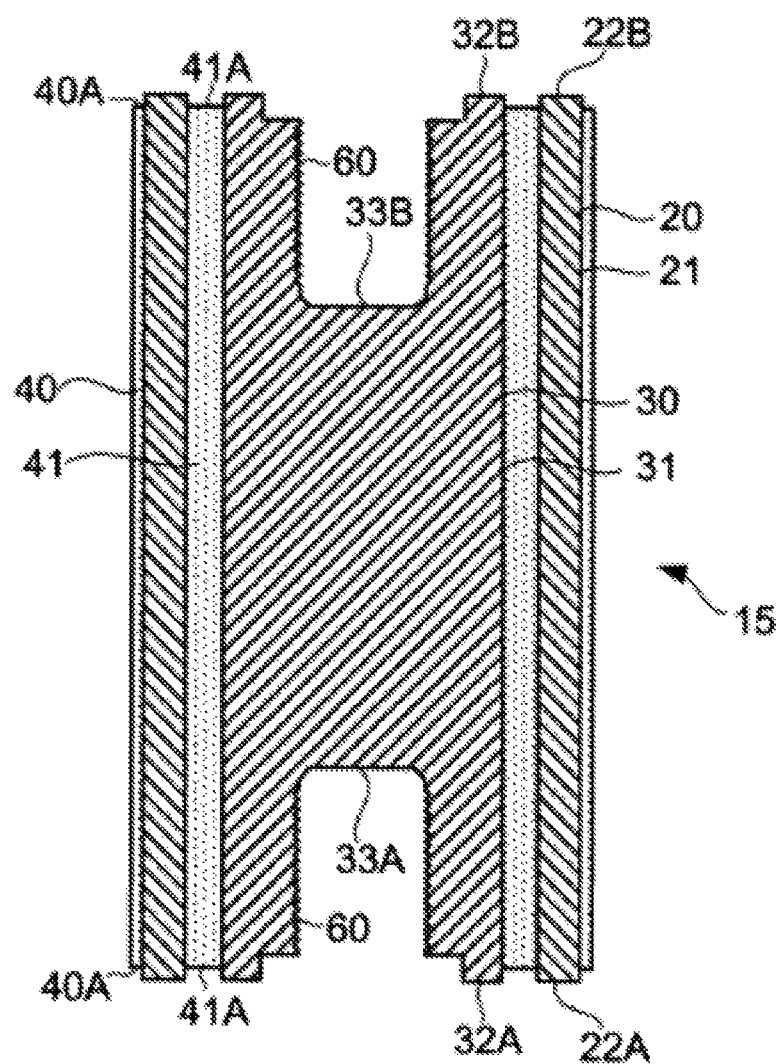
FIG. 19 is a cross-sectional view of a spacing tube according to an exemplary embodiment of the present disclosure.

FIG. 19 is a cross-sectional view of a spacing tube 15 according to an eighth exemplary embodiment of the present disclosure. The spacing tube 15 according to the eighth includes a first conductor 20, a second conductor 30, an insulator 40, and an insulator 41, similarly to the spacing tube 10 of the first exemplary embodiment.

In the spacing tube 15, an end face 32A of the second conductor 30 extends in the same plane as an end face 22A of the first conductor 20, and an end face 32B of the second conductor 30 extends in the same plane as an end face 22B of the first conductor 20. Each of the end faces 22A, 22B, 32A and 32B protrudes in relation to an end face insulator 40 and an end face 41A of the insulator 41. The end faces 32A and 32B of the second conductor 30 form annular ring-shaped electrical connection portions of an annular ring shape inside the first conductor 20. The second conductor 30 is the same as the spacing tube 10 according to the first exemplary embodiment in that the second conductor 30 includes, as fastened portions, the recessed portions 33A and 33B in the both ends thereof. The first conductor 20 and the second conductor 30 are disposed such that the centers thereof coincide with each other, and electrically separated from each other. That is, the first conductor 20 and the second conductor 30 are electrically separated from each other in the radial direction of the spacing tube 15.

The configurations of the first conductor 20, the insulator 40, and the insulator 41 are the same as those of the spacing tube 10 according to the first exemplary embodiment. Thus, detailed descriptions of these components will be omitted.

Figure 20:
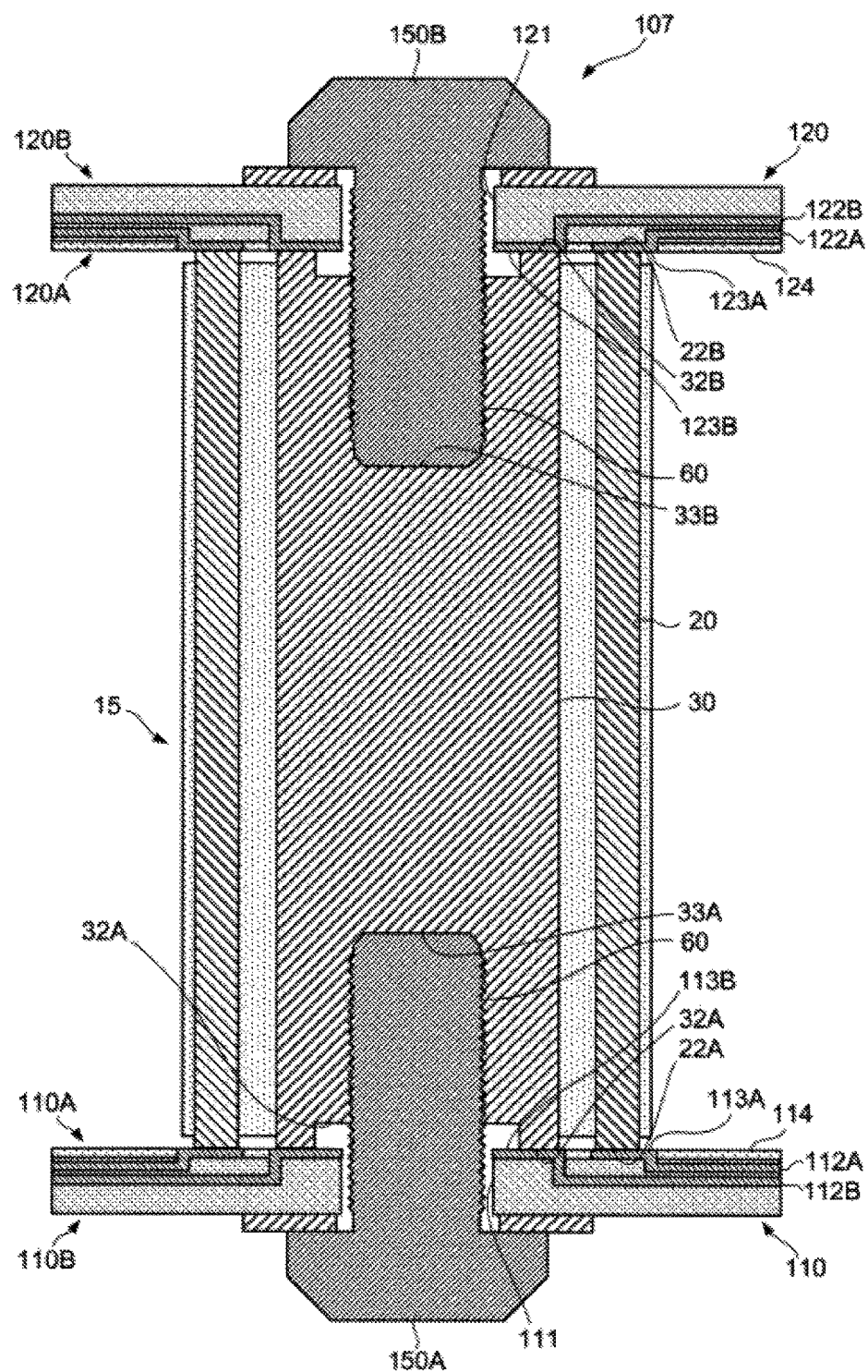
FIG. 20 is a cross-sectional view illustrating a partial configuration of a wiring board assembly structure according to an exemplary embodiment of the present disclosure.

FIG. 20 is a cross-sectional view illustrating a partial configuration of a wiring board assembly structure 107 according to the eighth exemplary embodiment of the present disclosure. The wiring board assembly structure 107 includes the aforementioned spacing tube 15, a printed wiring board 110 attached to one end of the spacing tube 15, and a printed wiring board 120 attached to the other end of the spacing tube 15.

The printed wiring board 110 and the printed wiring board 120 are connected to be parallel to each other while maintaining a predetermined spacing therebetween through the spacing tube 15. Although only one spacing tube 15 is indicated in the example illustrated in FIG. 20, the connection of the printed wiring board 110 and the printed wiring board 120 may be performed two or more spacing tubes 15.

The printed wiring board 110 includes a through hole 111 at an attachment position of the spacing tube 15. The printed wiring board 110 is attached to one end of the spacing tube 15 by a screw 150A which is inserted through the through hole 111 from a surface 110b side and fastened to the recessed portion 33A of the second conductor 30 of the spacing tube 15.

The printed wiring board 110 includes wiring patterns 112A and 112B at a surface 110A side where the spacing tube 15 is attached. The wiring pattern 112B includes an electrode 113B exposed to the surface in an outer circumferential surface of the through hole 111. The wiring pattern 112A includes an electrode 113A exposed to the surface outside the electrode 113B. The wiring patterns 112A and 112B are covered with a resist 114 except for the electrodes 113A and 113B.

The end face 22A of the first conductor 20 of the spacing tube 15 is abutted on the electrode 113A of the printed wiring board 110. That is, the first conductor 20 is electrically connected to the electrode 113A and wiring pattern 112A which are provided at the surface 110A side of the printed wiring board 110. Meanwhile, the end face 32A of the second conductor 30 of the spacing tube 15 is abutted on the electrode 113B of the printed wiring board 110. That is, the second conductor 30 of the spacing tube 15 is electrically connected to the electrode 113B and the wiring pattern 112B which are provided at the surface 110A side of the printed wiring board 110.

A screw 150A is inserted through the through hole 111 from the surface 110b side of the printed wiring board 110, and engaged with threads 60 formed on an inner circumferential surface of the recessed portion 33A of the second conductor 30 of the spacing tube 10, thereby being fastened to the recessed portion 33A.

Meanwhile, the printed wiring board 120 includes a through hole 121 at an attachment position of the spacing tube 15 similarly to the printed wiring board 110. The printed wiring board 120 is attached to the other end of the spacing tube 15 by a screw 150B which is inserted through the through hole 121 from the surface 120B side and fastened to the recessed portion 33B of the second conductor 30 of the spacing tube 15.

The printed wiring board 120 includes wiring patterns 122A and 122B formed at the surface 120A side where the spacing tube 15 is attached. The wiring pattern 122B includes an electrode 123B exposed to the surface in the outer circumferential portion of the through hole 121. The wiring pattern 122A includes an electrode 123A exposed to the surface outside the electrode 123B. The wiring patterns 122A and 122B are covered with the resist 124 except for the electrodes 123A and 123B.

The end face 22B of the first conductor 20 of the spacing tube 15 is abutted on the electrode 123A of the printed wiring board 120. That is, the first conductor 20 is electrically connected to the electrode 123A and the wiring pattern 122A which are provided at the surface side of the printed wiring board 120. Meanwhile, the end face 32B of the second conductor 30 of the spacing tube 15 is abutted on the electrode 123B of the printed wiring board 120. That is, the second conductor 30 of the spacing tube 15 is electrically connected to the electrode 123B and the wiring pattern 122B which are provided at the surface 120A side of the printed wiring board 120.

A screw 150B is inserted through the through hole 121 from the surface 120B side of the printed wiring board 120, and engaged with threads 60 formed on inner circumferential surface of the recessed portion 33B of the second conductor 30 of the spacing tube 15, thereby being fastened to the recessed portion 33B. A washer 160A is provided between the screw 150A and the surface 110B of the printed wiring board 110.

As described above, because two conductive paths are formed between the printed wiring board 110 and the printed wiring board 120 through the spacing tube 15, two different potentials may be transferred between the printed wiring board 110 and the printed wiring board 120 through the spacing tube 15. For example, a ground potential may be transferred between the wiring pattern 112A and the wiring pattern 122A through the first conductor 20 and a power potential may be transferred between the wiring pattern 112B and the wiring pattern 122B through the second conductor 30.

According to the spacing tube 15 and the wiring board assembly structure 107 of the eighth exemplary embodiment, the printed wiring board 110 and the printed wiring board 120 may be connected with each other not only mechanically but also electrically while maintaining a predetermined spacing therebetween. In addition, because the spacing tube 15 includes the first conductor 20 and second conductor 30 which are electrically separated from each other, two different potentials may be transferred between the printed wiring board 110 and the printed wiring board 120. Further, the first conductor 20 and the second conductor 30 are electrically separated from each other in the radial direction of the spacing tube 15, and includes, as fastened portions to be fastened to fastening members, the recessed portions 33A and 33B in the both ends of the second conductor 30. Thus, positioning of the spacing tube 15 and the printed wiring boards 110 and 120 in the direction around the axis of the spacing tube 15 becomes needless as in the first exemplary embodiment.

Further, according to the spacing tube 15 and the wiring board assembly structure 107 of the eighth exemplary embodiment, the first conductor 20 and the second conductor 30 are electrically connected to the wiring pattern formed on one surface of each printed wiring board. Accordingly, the electrical connection of printed wiring boards, each of which is formed with a wiring pattern on only one surface, may be made. In addition, although the present exemplary embodiment exemplifies the recessed portions 33A and 33B as the fastened portions provided on the second conductor 30, a through hole or a protruding portion exemplified in each of the exemplary embodiments described above may be provided as the fastened portions. In the present exemplary embodiment, the screws 150A and 150B do not participate in the electrical connection of the wiring boards.

Accordingly, for example, a material such as a non-conductive resin may be used as a material for the screws 150A and 150B. As a result, even if, for example, two different potentials which are different from a ground potential are conducted, the conductors are not exposed to the surface 110B side of the printed wiring board 110 and the surface 120B side of the printed wiring board 120 so that a worker's safety may be secured at the time of energizing.

Ninth Exemplary Embodiment

Figure 21A:
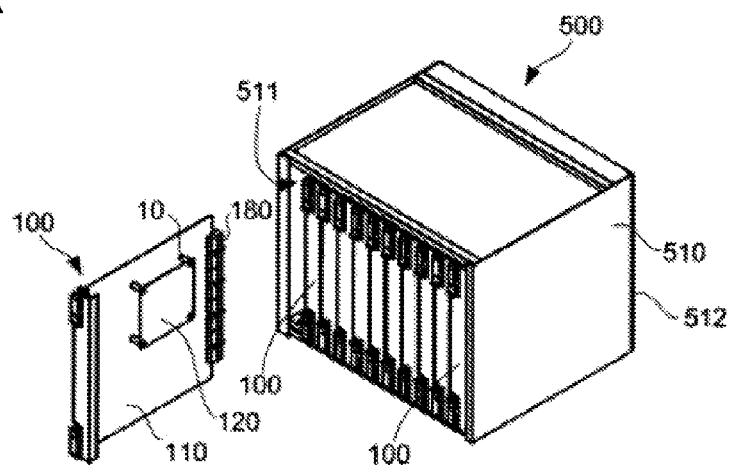
FIG. 21A is a perspective view of an electronic device according to an exemplary embodiment of the present disclosure.

FIGS. 21A and 22B are perspective views of an electronic device 500 according to a ninth exemplary embodiment of the present disclosure. The electronic device 500 includes a plurality of wiring board assembly structures 100 and a shelf 510 that accommodates the plurality of wiring board assembly structures 100. The electronic device 500 is an example of an electronic device in the present disclosure, and the shelf 510 is an example of an accommodation body in the present disclosure.

In each of the plurality of wiring board assembly structures 100, the printed wiring board 110 and the printed wiring board 120 are electrically and mechanically connected with each other through spacing tubes 10. In addition, a connector 180 is mounted on the printed wiring board 110 to be engaged with a connector (not illustrated) mounted on a rear plate 512 of the shelf 510.

The shelf 510 includes an accommodation space capable of accommodating a plurality of wiring board assembly structures 100, the wiring board assembly structures 100 are inserted from a front opening 511. The rear plate 512 of the shelf 510 is provided with a plurality of connectors (not illustrated) which correspond to the wiring board assembly structures 100, respectively. When the connectors 180 of the printed wiring boards 110 are engaged with the corresponding connectors, a circuit formed on the wiring board assembly structures 100 and a circuit formed on the rear plate 512 of the shelf are electrically connected with each other.

Figure 21B:
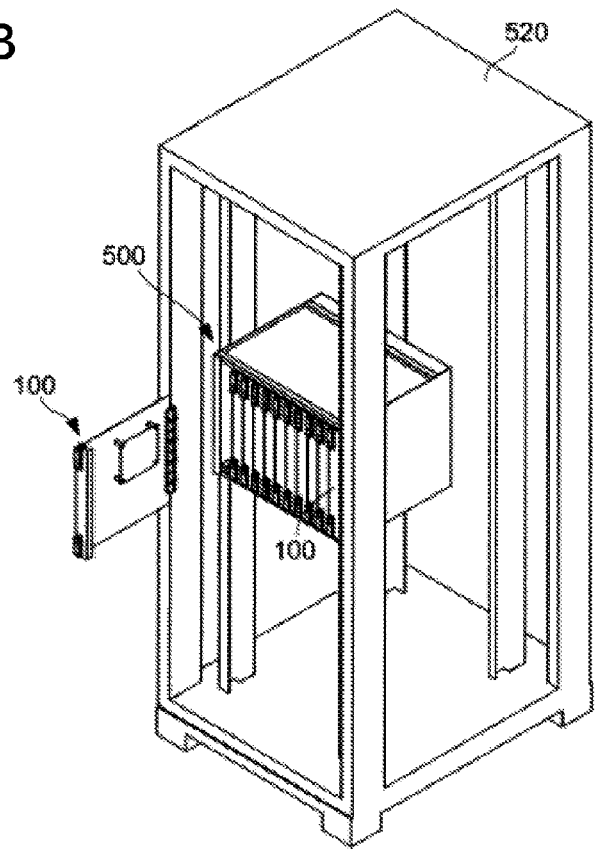
FIG. 21B is a perspective view of an electronic device according to an exemplary embodiment of the present disclosure.

As illustrated in FIG. 21B, the electronic device 500 may be attached to a rack 520. Although only one electronic device 500 is indicated in FIG. 21B, a plurality of electronic devices 500 may be attached to the rack 520.

The electronic device 500 may be, for example, an optical transmission device that performs transmission/reception of an optical signal. In such a case, the wiring board assembly structures accommodated in the shelf 510 may include the aforementioned optical module 400.

In addition, although the present exemplary embodiment exemplifies a case in which the electronic device 500 includes the wiring board assembly structure 100 according to the first exemplary embodiment, the electronic device 500 may be configured to include the wiring board assembly structures 101 to 107 according to the second to eighth exemplary embodiments.

Figure 22:
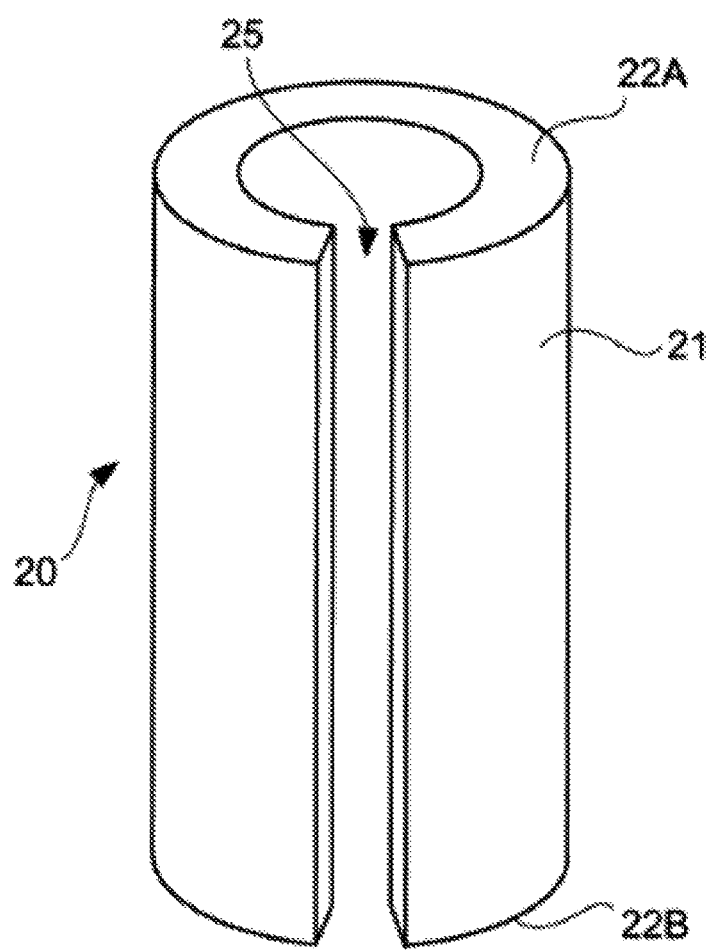
FIG. 22 is a perspective view of a first conductor according to an exemplary embodiment of the present disclosure.

The present disclosure may be variously modified without being limited to each of the aforementioned exemplary embodiments. For example, although the external shape of the spacing tube in each of the aforementioned exemplary embodiments is a columnar shape, it may be, for example, a prismatic shape. In addition, the second conductor 30 of the spacing tube may be properly modified. Further, although the external shape of the first conductor 20 of the spacing tube in each of the aforementioned exemplary embodiments is a cylindrical shape, it may be, for example, a square cylinder shape. In addition, the side face 21 and end faces 22A and 22B of the first conductor 20 may include a slit 25 as illustrated in FIG. 22. That is, a "tubular shape" in the external shape of the first conductor 20 may include the shape as illustrated in FIG. 22. In addition, a "ring shape" in the external shape of the end faces 22A and 22B of the first conductor 20 that form electrical connection portions may also include the shape as illustrated in FIG. 22. Further, in each of the aforementioned exemplary embodiments, the insulator 41 is provided between the first conductor 20 and the second conductor 30. However, a space may be provided between the first conductor and the second conductor. That is, when it is described that the first conductor 20 and the second conductor 30 are "electrically separated from each other", it includes a case in which a space or an insulator is interposed between the first conductor 20 and the second conductor 30. Further, although each of the aforementioned exemplary embodiments has exemplified the case in which power supply is executed between a plurality of printed wiring boards through a spacing tube, signal transmission may be executed between the plurality of printed wiring boards through the spacing tube.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device comprising:
  a spacing tube including a first conductor of a tubular shape with both end faces forming electrical connection, and a second conductor provided inside the first conductor to be electrically spaced from the first conductor, the second conductor including a plurality of recesses to be engaged with screws in both ends thereof; and
  a first wiring board and a second wiring board which are attached to opposite ends of the spacing tube by the screws fastened to the plurality of recesses, respectively, and electrically coupled with each other through the first conductor and the second conductor, and wherein an outer surface of the second conductor is covered by a first insulator between the first wiring board and the second wiring board.

2. The electronic device according to claim 1, wherein the first insulator is provided between the first conductor and the second conductor, and wherein a second insulator covers a side face of the first conductor.

3. The electronic device according to claim 2, wherein the both end faces of the first conductor protrude in relation to both end faces of the first insulator and the second insulator.

4. The electronic device according to claim 1, wherein the spacing tube further includes:

a third conductor of a tubular shape between the first conductor and the second conductor or outside the first conductor to be electrically separated from the first conductor and the second conductor, both end faces of the third conductor forming electrical connection.

5. The electronic device according to claim 1, wherein at least one of the recesses included in the second conductor includes, as a fastened portion, a recessed portion which is recessed in relation to one of the end faces of the first conductor, in at least one end thereof.

6. The electronic device according to claim 1, wherein the recesses are recessed in relation to the end faces of the first conductor, in the both ends thereof.

7. The electronic device according to claim 1, wherein the second conductor includes, as a fastened portion, a through hole that penetrates the second conductor from one end to the other end.

8. An electronic device comprising:

a spacing tube including a first conductor of a tubular shape with both end faces forming electrical connection, and a second conductor provided inside the first conductor to be electrically spaced from the first conductor, the second conductor including, as a fastened portion, a plurality of protruding portions, each of which protrudes in relation to one of the end face of the first conductor, in at least one end thereof; and a first wiring board and a second wiring board which are attached to opposite ends of the spacing tube by nuts fastened to the plurality of protruding portions, respectively, and electrically coupled with each other through the first conductor and the second conductor, and wherein an outer surface of the second conductor is covered by a first insulator between the first wiring board and the second wiring board.

9. An electronic device comprising:

a first spacing tube including a first conductor of a tubular shape with both end faces forming electrical connection, and a second conductor provided inside the first conductor to be electrically separated from the first conductor and including a first plurality of recesses to be engaged with first screws in both ends thereof;

a second spacing tube including a third conductor of a tubular shape with both end faces forming electrical connection, and a fourth conductor provided inside the third conductor to be electrically separated from the third conductor and including a second plurality of recesses to be engaged with second screws in both ends thereof, the fourth conductor being fastened to the second conductor of the first spacing tube;

a first wiring board attached to one end of the first spacing tube by one of the first screws, and including wiring patterns on both surfaces thereof;

a second wiring board attached to one end of the second spacing tube by one of the second screws, and including wiring patterns on both surfaces thereof; and a third wiring board sandwiched between the first spacing tube and the second spacing tube, and including wiring patterns on both surfaces thereof, wherein a wiring pattern on one surface of the first wiring board and a wiring pattern of one surface of the third wiring board are electrically coupled with each other through the first conductor, a wiring pattern on one surface of the second wiring board and a wiring pattern on the other surface of the third wiring board are electrically coupled with each other through the third conductor, and a wiring pattern on the other surface of the first wiring board and a wiring pattern on the other surface of the second wiring board are electrically coupled with each other through the second conductor and the fourth conductor.

10. An electronic device comprising:

a spacing tube including a first conductor of a tubular shape with both end faces forming electrical connection, and a second conductor provided inside the first conductor to be electrically spaced from the first conductor, the second conductor including a recessed portion which is recessed in relation to one of the end faces of the first conductor, and a protruding portion which protrudes in relation to the other end face of the first conductor, and a first wiring board and a second wiring board which are attached to opposite ends of the spacing tube by a nut fastened to the protruding portion or a screw fastened to the recessed portion, respectively, and electrically coupled with each other through the first conductor and the second conductor, wherein an outer surface of the second conductor is covered by a first insulator between the first wiring board and the second wiring board.

11. The electronic device according to claim 1, wherein each of the first wiring board and the second wiring board includes a first wiring pattern provided on a surface side where the spacing tube is attached, and a second wiring pattern provided on a surface opposite to the surface where the spacing tube is attached, the first wiring pattern of the first wiring board and the first wiring pattern of the second wiring board are electrically coupled with each other through the first conductor, and the second wiring pattern of the first wiring board and the second wiring pattern of the second wiring board are electrically coupled with each other through the second conductor.

12. The electronic device according to claim 11, wherein at least one of the recesses included in the second conductor includes, as a fastened portion, a recessed portion which is recessed in relation to one of the end faces of the first conductor, in at least one end thereof, and the second wiring pattern of at least one of the first wiring board and the second wiring board is electrically coupled to the second connector through one of the screws being fastened to the recessed portion.

13. The electronic device according to claim 11, wherein the second conductor includes, as the plurality of recesses, recessed portions which are recessed in relation to the end faces of the first conductor, in the both ends thereof, and the second wiring pattern of each of the first wiring board and the second wiring board is electrically coupled to the second conductor through the screws which are fastened to the recessed portions, respectively.

14. The electronic device according to claim 11, wherein the second conductor includes, as a fastened portion, a through hole which penetrates the second conductor from one end to the other end, and the second wiring pattern of each of the first wiring board and the second wiring board is electrically coupled to the second conductor through one of the screws being inserted into the through hole.

15. A spacing tube comprising:
a first conductor of a tubular shape with both end faces forming electrical connection; and
a second conductor provided inside the first conductor to be electrically separated from the first conductor, and including a plurality of recesses to be engaged with screws in both ends thereof,
wherein an outer surface of the second conductor is covered by a first insulator.

* * * * *